United States Patent
Kim et al.

(10) Patent No.: US 11,449,417 B2
(45) Date of Patent: Sep. 20, 2022

(54) MEMORY CONTROLLER PERFORMING HOST-AWARE PERFORMANCE BOOSTER MODE AND METHOD OF OPERATING THE SAME

(71) Applicant: SK hynix Inc., Icheon (KR)

(72) Inventors: Kwang Su Kim, Seongnam (KR); Youn Won Park, Suwon (KR); Seok Jun Lee, Seoul (KR)

(73) Assignee: SK hynix Inc., Icheon (KR)

( * ) Notice: Subject to any disclaimer, the term of this patent is extended or adjusted under 35 U.S.C. 154(b) by 160 days.

(21) Appl. No.: 16/904,391

(22) Filed: Jun. 17, 2020

(65) Prior Publication Data

US 2021/0133095 A1    May 6, 2021

(30) Foreign Application Priority Data

Oct. 31, 2019    (KR) .................. 10-2019-0137846

(51) Int. Cl.
| | | |
|---|---|---|
| *G06F 12/02* | (2006.01) | |
| *G06F 12/0873* | (2016.01) | |
| *G06F 12/0871* | (2016.01) | |
| *G11C 16/10* | (2006.01) | |
| *G11C 8/04* | (2006.01) | |

(52) U.S. Cl.
CPC ...... *G06F 12/0246* (2013.01); *G06F 12/0871* (2013.01); *G06F 12/0873* (2013.01); *G11C 8/04* (2013.01); *G11C 16/10* (2013.01); *G06F 2212/7201* (2013.01); *G06F 2212/7202* (2013.01)

(58) Field of Classification Search
CPC ............ G06F 12/0246; G06F 12/0871; G06F 12/0873; G06F 2212/7202; G06F 2212/7201; G11C 16/10; G11C 8/04
See application file for complete search history.

(56) References Cited

U.S. PATENT DOCUMENTS

| | | | |
|---|---|---|---|
| 2010/0049937 A1* | 2/2010 | Chauvet | G06F 3/0611 711/170 |
| 2016/0274820 A1* | 9/2016 | Suzuki | G06F 13/1668 |
| 2017/0031823 A1* | 2/2017 | Ross | G06F 12/0862 |
| 2018/0039578 A1* | 2/2018 | Yun | G06F 11/1068 |
| 2019/0042405 A1* | 2/2019 | Boyle | G06F 12/0253 |

FOREIGN PATENT DOCUMENTS

| | | |
|---|---|---|
| KR | 20170108296 A | 9/2017 |
| KR | 20180027806 A | 3/2018 |

* cited by examiner

*Primary Examiner* — Nanci N Wong

(57) ABSTRACT

An electronic device includes a memory controller selecting map data to be output to a host. The memory controller includes an address counter and a map data selector. The address counter counts a number of times a logical block address corresponding to a request is received based on the request received from the host and outputs an activation signal indicating that an index to which the logical block address belongs is an activation index when an activation count corresponding to the index is equal to or greater than a preset value, the activation count being generated based on a counting result. The map data selector selects map data to be output to the host based on the activation signal. The address counter decreases the activation count by a preset size when a size of the selected map data exceeds a storage capacity of the host allocated for storing map data.

20 Claims, 18 Drawing Sheets

FIG. 3

| INDEX | 1 | 2 | 3 | 4 | 5 | 6 | 7 | 8 |
|---|---|---|---|---|---|---|---|---|
| LBA (Logical Block Address) | LBA0~LBA9 | LBA10~LBA19 | LBA20~LBA29 | LBA30~LBA39 | LBA40~LBA49 | LBA50~LBA59 | LBA60~LBA69 | LBA70~LBA79 |

FIG. 6

| INDEX | LBA (Logical Block Address) | PBA (Physical Block Address) | |
|---|---|---|---|
| 1 | LBA0 | PBA0 | ⎫ |
|  | LBA1 | PBA1 |  |
|  | LBA2 | PBA2 |  |
|  | LBA3 | PBA3 |  |
|  | LBA4 | PBA4 | MAP_DATA1 |
|  | LBA5 | PBA5 |  |
|  | LBA6 | PBA6 |  |
|  | LBA7 | PBA7 |  |
|  | LBA8 | PBA8 |  |
|  | LBA9 | PBA9 | ⎭ |
| 2 | LBA10 | PBA10 | ⎫ |
|  | LBA11 | PBA11 |  |
|  | ⋮ | ⋮ | MAP_DATA2 |
|  | LBA18 | PBA18 |  |
|  | LBA19 | PBA19 | ⎭ |
| ⋮ | ⋮ | ⋮ | ⋮ |
| 8 | LBA70 | PBA70 | ⎫ |
|  | LBA71 | PBA71 |  |
|  | ⋮ | ⋮ | MAP_DATA8 |
|  | LBA78 | PBA78 |  |
|  | LBA79 | PBA79 | ⎭ |

FIG. 12

| INDEX | 1 | 2 | 3 | 4 | 5 | 6 | 7 | 8 |
|---|---|---|---|---|---|---|---|---|
| ACTIVE COUNT | 2048 | 4096 | 8192(MAX) | 1024 | 2048 | 100 | 100 | 200 |

⇒

| INDEX | 1 | 2 | 3 | 4 | 5 | 6 | 7 | 8 |
|---|---|---|---|---|---|---|---|---|
| ACTIVE COUNT | 1024 | 2048 | 0 | 512 | 1024 | 50 | 50 | 100 |

MEMORY CONTROLLER PERFORMING HOST-AWARE PERFORMANCE BOOSTER MODE AND METHOD OF OPERATING THE SAME

CROSS-REFERENCE TO RELATED APPLICATION

The present application claims priority under 35 U.S.C. § 119(a) to Korean Patent Application Number 10-2019-0137846, filed on Oct. 31, 2019, in the Korean Intellectual Property Office, the entire disclosure of which is incorporated herein by reference.

BACKGROUND

Field of Invention

The present disclosure relates to an electronic device, and more particularly, to a memory controller and a method of operating the same.

Description of Related Art

A storage device is a device that stores data under the control of a host device such as a computer, a smart phone, or a smart pad. The storage device includes a device that stores data in a magnetic disk, such as a hard disk drive (HDD), a device that stores data in a semiconductor memory, such as a solid state drive (SSD) or a memory card. The semiconductor memory may include a non-volatile memory.

The storage device may include a memory device in which data is stored and a memory controller that stores data in the memory device. The memory device may be classified into a volatile memory and a non-volatile memory. Here, the non-volatile memory includes a read only memory (ROM), a programmable ROM (PROM), an electrically programmable ROM (EPROM), an electrically erasable and programmable ROM (EPM), a flash memory, a phase-change RAM (PRAM), a magnetic RAM (MRAM), a resistive RAM (RRAM), a ferroelectric RAM (FRAM), and the like.

SUMMARY

An embodiment of the present disclosure provides a memory controller and a method of operating the same, capable of selecting map data to be transmitted to a host by increasing or decreasing an activation count corresponding to an index to which a logical block address belongs in a host-aware performance booster (HPB) mode.

A memory controller according to an embodiment of the present disclosure includes an address counter configured to count a number of times a logical block address corresponding to a request is received based on the request received from a host, and output an activation signal indicating that an index to which the logical block address belongs is an activation index when an activation count corresponding to the index is equal to or greater than a preset reference value, the activation count being generated based on a counting result and a map data selector configured to select map data to be output to the host based on the activation signal, wherein the address counter decreases the activation count by a preset size when a size of the selected map data exceeds a storage capacity of the host allocated for storing map data.

A method of operating a memory controller according to an embodiment of the present disclosure may include receiving a request and a logical block address corresponding to the request from a host, counting a number of times the logical block address is received based on the request received from the host, and generating an activation count based on a counting result, outputting a first activation signal indicating that an index to which the logical block address belongs is an activation index when the activation count is equal to or greater than a preset reference value, selecting map data to be output to the host based on the first activation signal, detecting a deactivation index corresponding to an activation count that is less than the preset reference value when a size of the selected map data exceeds a storage capacity of the host allocated for storing map data, outputting a second activation signal based on the deactivation index and decreasing activation counts of indices when a size of map data selected based on the second activation signal exceeds the storage capacity of the host.

According to the present technology, when a host memory is in a saturation state, the activation count corresponding to the index to which the logical block address belongs may be decreased by a preset size, and the map data to be transmitted to the host again may be selected in a state in which the activation count is decreased.

BRIEF DESCRIPTION OF THE DRAWINGS

FIG. 3 is a diagram for describing indices to which logical block addresses belong according to an embodiment.

FIG. 6 is a diagram for describing map data according to an embodiment.

FIG. 12 is a diagram for describing a method of decreasing an activation count according to a third embodiment.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure will be described with reference to the accompanying drawings so that those skilled in the art may easily implement the technical spirit of the present disclosure.

Figure 1:
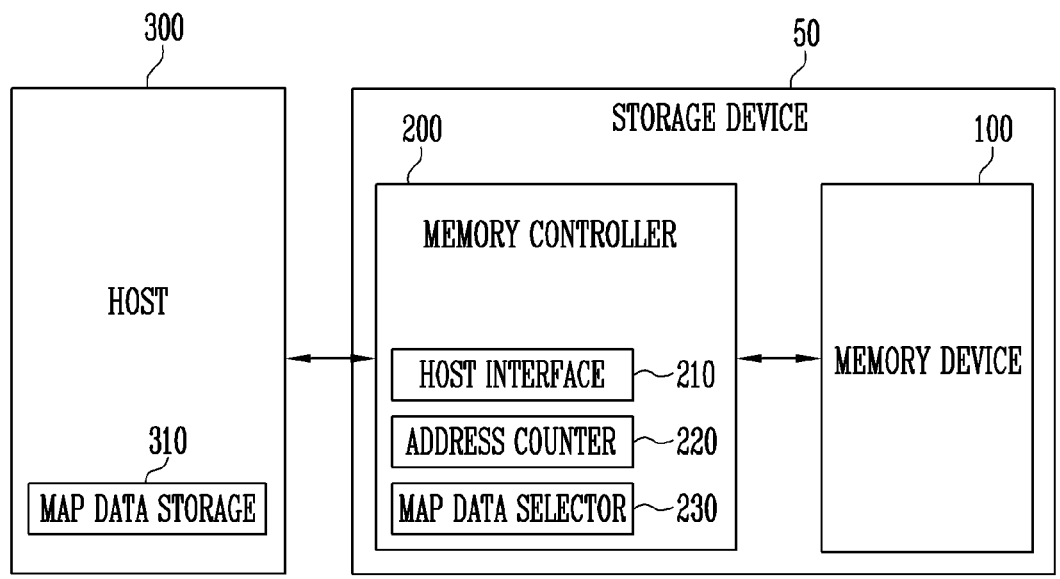
FIG. 1 is a block diagram for describing a storage device according to an embodiment.

FIG. 1 is a block diagram for describing a storage device 50 according to an embodiment.

Referring to FIG. 1, the storage device 50 may include a memory device 100 and a memory controller 200.

The storage device 50 may store data under the control of a host 300 such as a cellular phone, a smartphone, an MP3 player, a laptop computer, a desktop computer, a game player, a TV, a tablet PC, an in-vehicle infotainment system, or the like.

The storage device 50 may be manufactured as one of various types of storage devices according to a host interface that is a communication method with the host 300. For example, the storage device 50 may be configured as any one of various types of storage devices, such as an SSD, a multimedia card in a form of an MMC, an eMMC, an RS-MMC, or a micro-MMC, a secure digital card in a form of an SD, a mini-SD, or a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, a memory stick, and so on.

The storage device 50 may be manufactured as any one of various types of packages, such as a package on package (POP), a system in package (SIP), a system on chip (SOC), a multi-chip package (MCP), a chip on board (COB), a wafer-level fabricated package (WFP), a wafer-level stack package (WSP), and so on.

The memory device 100 may store data. The memory device 100 operates under the control of the memory controller 200. The memory device 100 may include a memory cell array storing data. The memory cell array may include a plurality of memory blocks. Each of the memory blocks may include a plurality of memory cells, and the plurality of memory cells may configure a plurality of pages. In an embodiment, a page may be a unit for performing a write operation of storing data in the memory device 100 or a read operation of reading data stored in the memory device 100. A memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present disclosure, for convenience of description, it is assumed that the memory device 100 is a NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) memory device in which a charge storage layer is configured of an insulating film.

In an embodiment, the memory device 100 may include a single level cell (SLC) in which one bit of data is stored. Alternatively, the memory device 100 may store at least two bit of data in one memory cell. For example, the memory device 100 may include a multi-level cell (MLC) that stores two bits of data, a triple level cell (TLC) that stores three bits of data, or a quadruple level cell (QLC) that stores four bits of data.

The memory device 100 receives a command and an address from the memory controller 200 and accesses a memory region in the memory cell array that is selected by the address. That is, the memory device 100 may perform an operation corresponding to the command on the memory region selected by the address. For example, the memory device 100 may perform a write operation (or a program operation), a read operation, or an erase operation according to the received command. For example, when a program command is received, the memory device 100 may program data into the memory region selected by the address. When a read command is received, the memory device 100 may read data from the memory region selected by the address. When an erase command is received, the memory device 100 may erase data stored in the memory region selected by the address.

The memory controller 200 may control overall operations of the storage device 50.

When a power voltage is applied to the storage device 50, the memory controller 200 may execute firmware FW. When the memory device 100 is a flash memory, the memory controller 200 may operate firmware such as a flash translation layer (FTL) for controlling communication between the host 300 and the memory device 100.

In an embodiment, the memory controller 200 may receive write data and a logical block address (LBA) from the host 300 and translate the logical block address LBA into a physical block address (PBA) indicating an address of memory cells in the memory device 100 in which the write data is to be stored. In addition, the memory controller 200 may store a logical-physical address mapping table configuring a mapping relationship between the logical block address LBA and the physical block address PBA in a buffer memory.

The memory controller 200 may control the memory device 100 to perform the program operation, the read operation, the erase operation, or the like according to a request of the host 300. For example, when a program request is received from the host 300, the memory controller 200 may convert the program request into a program command, and provide the program command, a physical block address PBA, and write data to the memory device 100. When a read request is received from the host 300 together with a logical block address LBA, the memory controller 200 may convert the read request into a read command, select a physical block address PBA corresponding to the logical block address LBA, and then provide the read command and the physical block address PBA to the memory device 100. When an erase request is received from the host 300 together with a logical block address LBA, the memory controller 200 may convert the erase request into an erase command, select a physical block address PBA corresponding to the logical block address LBA, and then provide the erase command and the physical block address PBA to the memory device 100.

In an embodiment, the memory controller 200 may generate and transmit a command, an address, and data to the memory device 100 without receiving a request from the host 300. For example, the memory controller 200 may provide a command, an address, and data to the memory device 100 so as to perform background operations such as a program operation for wear leveling and a program operation for garbage collection.

In an embodiment, the memory controller 200 may include a host interface 210. The host interface 210 may receive a request REQUEST and a logical block address LBA from the host 300. The request REQUEST received from the host 300 may be a program (or write) request, a read request, or an erase request, and the logical block address LBA received from the host 300 may be an address corresponding to the received request. The host interface 210 may transfer the request and the logical block address LBA received from the host 300 to another component in the memory controller 200.

In addition, the host interface 210 may output map data received from another component in the memory controller 200 to the host 300. The map data transmitted to the host 300 may indicate a mapping relationship between a logical block address LBA frequently received from the host 300 and a physical block addresses PBA corresponding to the logical block address LBA, when the storage device 50 operates in a host-aware performance booster (HPB) mode.

In an embodiment, the memory controller 200 may further include an address counter 220. The address counter 220 may count the number of times the logical block address LBA is received from the host interface 210.

For example, when the address counter 220 receives the logical block address LBA, the address counter 220 may check an index to which the received logical block address LBA belongs. Here, an index may be a unit for distinguishing a plurality of logical block addresses from each other. That is, the logical block address LBA received from the host interface 210 may be included in any one of the plurality of indices. For example, when receiving any one of 0-th to ninth logical block addresses from the host interface 210, the received logical block address LBA may be included in a first index. When receiving any one of tenth to nineteenth logical block addresses from the host interface 210, the received logical block address LBA may be included in a second index.

Therefore, the address counter 220 may check the index to which the received logical block address LBA belongs, and then increase an activation count corresponding to the index. At this time, the activation count is the number of times the memory controller 200 receives a logical block address LBA corresponding to the index from the host 300, and each index may have its own activation count. For example, the address counter 220 may sequentially increase the activation count of the first index from '1' to '1024' whenever receiving any of the 0-th to ninth logical block addresses corresponding to the first index.

As a result, the address counter 220 may increase the activation count corresponding to the index according to the number of times any logical block address LBA corresponding to the index is received. The increased activation count may be stored in the address counter 220.

In addition, when the activation count, which is a value determined by the address counter 220, is equal to or greater than a reference value, the address counter 220 may output an activation signal indicating that the activation count corresponding to the index is equal to or greater than the reference value. The reference value may be set in advance. The map data corresponding to the index may be output to the host 300 in response to the activation signal output from the address counter 220.

In an embodiment, the memory controller 200 may include a map data selector 230. The map data selector 230 may select map data to be transmitted to the host 300. The map data selected by the map data selector 230 may be determined according to an activation count corresponding to an index when the storage device 50 operates in the HPB mode. For example, when the activation count corresponding to the index becomes equal to or greater than the reference value, the map data selector 230 may transmit map data indicating a mapping relationship between logical block addresses belonging to the index and corresponding physical block addresses to the host 300.

In an embodiment, when the map data may no longer be stored in the host 300, the map data selector 230 may select map data to be transmitted to the host 300 again. For example, the map data selector 230 may detect an index of which an activation count that is less than the reference value, and select map data corresponding to an index except for the detected index as the map data to be transmitted to the host 300. That is, the map data selector 230 may select the map data to be transmitted to the host 300 among map data corresponding to indices of which active counts are equal to or greater than the reference value.

However, when there is no index of which an activation count that is less than the reference value, or when an amount of the selected map data exceeds an amount of map data that the host 300 can store, the map data selector 230 may output a decrease request to the address counter 220. The address counter 220 may decrease activation counts corresponding to indices in response to the decrease request. When the activation counts are decreased, the map data selector 230 may select map data to be transmitted to the host 300 again and output the selected map data to the host 300.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store write data provided by the host 300 in the buffer memory, and then transmit the write data temporarily stored in the buffer memory to the memory device 100.

In various embodiments, the buffer memory may be used as an operation memory and a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR) SDRAM, or Rambus dynamic random access memory (RDRAM), a static random access memory (SRAM), or the like.

In various embodiments, the buffer memory may be disposed outside the storage device 50. In this case, volatile memory devices connected to the storage device 50 may serve as the buffer memory.

In an embodiment, the memory controller 200 may control at least two or more memory devices. In this case, the memory controller 200 may control the two or more memory devices according to an interleaving method in order to improve operation performance of the storage device 50.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), a load reduced DIMM (LRDIMM), and so on.

In an embodiment, the host 300 may include a map data storage 310. The map data storage 310 may be a host memory. That is, the map data storage 310 may be a storage area included in the host 300.

In an embodiment, the map data storage 310 may store the map data received from the memory controller 200. The map data storage 310 may store map data corresponding to an index having a relatively high activation count when the storage device 50 operates in the HPB mode. For example, the relatively high activation count may be equal to or greater than the reference value.

However, since the map data storage 310 has a limited size, only map data of the limited size can be stored in the map data storage 310. Therefore, when the map data stored in the map data storage 310 is in a saturation state, the map data storage 310 may receive and store the map data from the map data selector 230 again.

Figure 2:
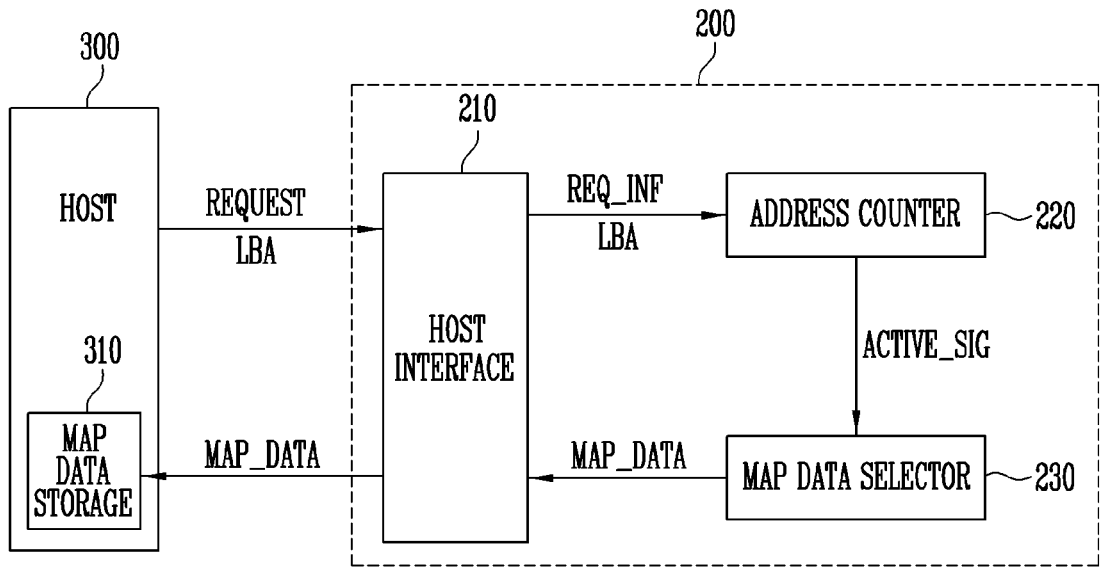
FIG. 2 is a diagram for describing a structure of a memory controller of FIG. 1 for transmitting map data to a host according to an embodiment.

FIG. 2 is a diagram for describing a structure of the memory controller 200 of FIG. 1 for transmitting map data to the host 300 according to an embodiment.

Referring to FIG. 2, the memory controller 200 may include the host interface 210, the address counter 220, and the map data selector 230, and the host 300 may include the map data storage 310.

In an embodiment, the host 300 may provide the memory controller 200 with a request REQUEST corresponding to an operation to be performed on the memory device 100 of FIG. 1 and a logical block address LBA corresponding to the request REQUEST. The request REQUEST provided by the host 300 may be any one of a program (or write) request, a read request, and an erase request. In addition, the logical block address LBA provided by the host 300 may be an address corresponding to any one of the program (or write) request, the read request, and the erase request.

Therefore, when the operation to be performed on the memory device 100 is the program (or write) operation, the host 300 may output the program (or write) request and a logical block address LBA corresponding to the program (or write) request. When the operation to be performed on the memory device 100 is the read operation, the host 300 may output the read request and a logical block address LBA corresponding to the read request. When the operation to be performed on the memory device 100 is the erase operation, the host 300 may output the erase request and a logical block address LBA corresponding to the erase request.

In an embodiment, when the host 300 outputs the request REQUEST and the logical block address LBA corresponding to the request REQUEST, the host interface 210 receives the request REQUEST and the logical block address LBA from the host 300, and then transmits request information REQ_INF indicating a type of the request REQUEST and the logical block address LBA to the address counter 220. The address counter 220 may check the type of the request REQUEST received from the host 300 based on the request information REQ_INF, and then increase an activation count of an index to which the logical block address LBA belongs. An index may be a unit for distinguishing a plurality of logical block addresses from each other. That is, the logical block address LBA received from the host interface 210 may belong to any one of a plurality of indices. In addition, an activation count is the number of times logical block addresses corresponding to one of the plurality of indices is received from the host 300, and may be set for each of the plurality of indices. The increased activation count may be stored in the address counter 220.

For example, when the request REQUEST received from the host 300 is the read request, the address counter 220 may increase the activation count of the index to which the logical block address LBA belongs. The address counter 220 may increase the activation count of the index to which the logical block address LBA belongs by 1 whenever receiving the logical block address LBA.

That is, when the logical block address LBA belonging to the same index is received from the host 300 a plurality of times, the activation count corresponding to the index may become relatively larger than an activation count corresponding to another index.

For another example, when the request REQUEST received from the host 300 is the program (or write) request, the address counter 220 may decrease the activation count of the index to which the logical block address LBA belongs. That is, mapping information between the logical block address LBA and a corresponding physical block address PBA is changed by processing the program (or write) request, which means that the corresponding mapping information is not frequently requested by the host 300. Therefore, the address counter 220 may decrease the activation count of the index to which the logical block address LBA belongs.

For another example, when the request REQUEST received from the host 300 is the erase request, the address counter 220 may decrease the activation count of the index to which the logical block address LBA belongs. That is, the mapping information between the logical block address LBA and the physical block address PBA is changed by processing the erase request, and thus the address counter 220 may decrease the activation count of the index to which the logical block address LBA belongs.

As a result, when certain data stored in the memory device 100 of FIG. 1 is relatively frequently requested by the host 300, an activation count of an index to which a logical block address LBA corresponding to the certain data belongs may be increased, and then, map data MAP_DATA indicating a mapping relationship between the logical block address LBA and a corresponding physical block address PBA may be transferred to the host 300. Therefore, the host 300 may access the memory device 100 at a high speed based on the map data MAP_DATA without translating the logical block address LBA into the physical block address PBA and by directing providing the physical block address PBA to the memory controller 200 instead of the logical block address LBA. Thus, when the storage device 50 of FIG. 1 operates in the HPB mode, the storage device 50 may operate at a high speed.

That is, when a logical block address LBA corresponding to a specific memory region is frequently received together with the read request from the host 300, map data MAP_DATA indicating a mapping relationship between the logical block address LBA and its corresponding physical block address PBA may be stored in the host 300. Accordingly, mapping conversion of a flash translation layer (FTL) in the memory controller 200 may be omitted, and thus an operation speed of the storage device 50 may be improved.

In an embodiment, when an activation count corresponding to a certain index is equal to or greater than the reference value, the address counter 220 may generate and output an activation signal ACTIVE_SIG. The reference value may be set in advance. The activation signal ACTIVE_SIG may be a signal for controlling an operation of outputting map data indicating a mapping relationship between a logical block address LBA and a physical block address PBA, which correspond to the certain index.

In an embodiment, the map data selector 230 may receive the activation signal ACTIVE_SIG from the address counter 220. In addition, the map data selector 230 may select map data MAP_DATA to be output to the host 300 in response to the activation signal ACTIVE_SIG.

For example, when the activation signal ACTIVE_SIG indicates that activation counts respectively corresponding to a first index and a second index are equal to or greater than the reference value, the map data selector 230 may output, to the host 300, map data MAP_DATA indicating mapping relationships between logical block addresses belonging to the first and second indices and physical block addresses corresponding to the logical block addresses.

The map data selector 230 may transmit the map data MAP_DATA selected in response to the activation signal ACTIVE_SIG to the host interface 210, and the host interface 210 may transfer the selected map data MAP_DATA to the host 300. When the map data MAP_DATA is transferred to the host 300, the map data storage 310 in the host 300 may store the map data MAP_DATA. The map data storage 310 may store map data corresponding to an index having a relatively high activation count when the storage device 50 operates in the HPB mode.

In an embodiment, when an amount of the map data MAP_DATA stored in the map data storage 310 reaches a size of the map data storage 310, the map data selector 230 may select new map data MAP_DATA and transfer the new map data MAP_DATA to the host 300. A method of selecting the new map data MAP_DATA by the map data selector 230 will be described in detail with reference to FIG. 8.

FIG. 3 is a diagram for describing indices to which logical block addresses belong according to an embodiment.

Referring to FIG. 3, a predetermined number of logical block addresses correspond to an index INDEX. In an embodiment, the address counter 220 of FIG. 2 may increase an activation count for each index INDEX to which a predetermined number of logical block addresses LBA belong. The index INDEX may be a unit for distinguishing a plurality of logical block addresses from each other. That is, a logical block address LBA received through the host interface 210 of FIG. 2 may belong to any one of the plurality of indices. In addition, an activation count is the number of times any logical block address LBA belonging to the index INDEX is received from the host 300. The increased activation count may be stored in the address counter 220.

In another embodiment, the number of logical block addresses LBA corresponding to each index INDEX may be changed, and the number of logical block addresses LBA corresponding to one index INDEX may be different from the number of logical block addresses LBA belonging to another index INDEX.

In FIG. 3, it is assumed that the number of indices INDEX is eight, and the number of logical block addresses LBA corresponding to each index INDEX is ten. In addition, it is assumed that the logical block address LBA received from the host 300 of FIG. 1 is any one of 0-th to seventy-ninth logical block addresses LBA0 to LBA79.

In an embodiment, logical block addresses corresponding to the first index INDEX1 may be the 0-th to ninth logical block addresses LBA0 to LBA9, logical block addresses corresponding to the second index INDEX2 may be the tenth to nineteenth logical block addresses LBA10 to LBA19, logical block addresses corresponding to the third index INDEX3 may be the twentieth to twenty-ninth logical block addresses LBA20 to LBA29, logical block addresses corresponding to the fourth index INDEX4 may be the thirtieth to thirty-ninth logical block addresses LBA30 to LBA39, logical block addresses corresponding to the fifth index INDEX5 may be the fortieth to forty-ninth logical block addresses LBA40 to LBA49, logical block addresses corresponding to the sixth index INDEX6 may be the fiftieth to fifty-ninth logical block addresses LBA50 to LBA59, logical block addresses corresponding to the seventh index INDEX7 may be the sixtieth to sixty-ninth logical block addresses LBA60 to LBA69, and logical block addresses corresponding to the eighth index INDEX8 may be the seventieth to seventy-ninth logical block addresses LBA70 to LBA79.

In an embodiment, when the request received from the host 300 of FIG. 1 is the read request, the logical block address LBA received together with the read request may correspond to any one of the first to eighth indices INDEX1 to INDEX8. That is, the logical block address LBA received together with the read request from the host 300 of FIG. 1 may be one of the 0-th to seventy-ninth logical block addresses LBA0 to LBA79, and each of the 0-th to seventy-ninth logical block addresses LBA0 to LBA79 may correspond to any one of the first to eighth indices INDEX1 to INDEX8.

For example, when the read request and the first logical block address LBA1 corresponding to the read request may be received from the host 300 of FIG. 1, since the first logical block address LBA1 may correspond to the first index INDEX1, the address counter 220 of FIG. 1 may increase an activation count corresponding to the first index INDEX1.

A method of increasing the activation count will be described in more detail with reference to FIG. 4.

Figure 4:
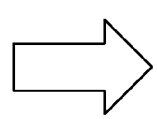
FIG. 4 is a diagram for describing a method of calculating an activation count according to an embodiment.

FIG. 4 is a diagram for describing a method of determining an activation count based on a logical block address received from a host according to an embodiment.

Referring to FIGS. 2 to 4, an activation count ACTIVE COUNT of FIG. 4 is stored in the address counter 220 of FIG. 2. First to eighth indices INDEX1 to INDEX8 of FIG. 4 are the same as the first to eighth indices INDEX1 to INDEX8 of FIG. 3.

That is, the first to eighth indices INDEX1 to INDEX8 of FIG. 4 may correspond to the 0-th to seventy-ninth logical block addresses LBA0 to LBA79 shown in FIG. 3 as follows: the first index INDEX1 may correspond to the 0-th to ninth logical block addresses LBA0 to LBA9; the second index INDEX2 may correspond to the tenth to nineteenth logical block addresses LBA10 to LBA19; the third index INDEX3 may correspond to the twentieth to twenty-ninth logical block addresses LBA20 to LBA29; the fourth index INDEX4 may correspond to the thirtieth to thirty-ninth logical block addresses LBA30 to LBA39; the fifth index INDEX5 may correspond to the fortieth to forty-ninth logical block addresses LBA40 to LBA49; the sixth index INDEX6 may correspond to the fiftieth to fifty-ninth logical block addresses LBA50 to LBA59; the seventh index INDEX7 may correspond to the sixtieth to sixty-ninth logical block addresses LBA60 to LBA69; and the eighth index INDEX8 may correspond to the seventieth to seventy-ninth logical block addresses LBA70 to LBA79.

In an embodiment, the activation count ACTIVE COUNT initially stored in the address counter 220 of FIG. 2 may be '0,' which is a default value. That is, before receiving the read request and the logical block address LBA corresponding to the read request from the host 300 of FIG. 2, the activation count ACTIVE COUNT corresponding to each of the first to eighth indices INDEX1 to INDEX8 may be '0.'

Thereafter, when receiving the read request and the logical block address LBA corresponding to the read request from the host 300 of FIG. 2, the activation count ACTIVE COUNT corresponding to the index INDEX to which the logical block address belongs may be increased.

In FIG. 4, since the number of times the 0-th to ninth logical block addresses LBA0 to LBA9 are received together with the read request from the host 300 of FIG. 2 is '1024,' the activation count ACTIVE COUNT corresponding to the first index INDEX1 to which the 0-th to ninth logical block addresses LBA0 to LBA9 belong may be '1024.' Since the number of times the tenth to nineteenth logical block addresses LBA10 to LBA19 are received together with the read request from the host 300 of FIG. 2 is '2048,' the activation count ACTIVE COUNT corresponding to the second index INDEX2 to which the tenth to nineteenth logical block addresses LBA10 to LBA19 belong may be '2048.'

In addition, since the number of times the twentieth to twenty-ninth logical block addresses LBA20 to LBA29 are received together with the read request from the host 300 of FIG. 2 is '2048,' the activation count ACTIVE COUNT corresponding to the third index INDEX3 to which the twentieth to twenty-ninth logical block addresses LBA20 to LBA29 belong may be '2048.' Since the number of times the thirtieth to thirty-ninth logical block addresses LBA30 to LBA39 are received together with the read request from the host 300 of FIG. 2 is '512,' the activation count ACTIVE COUNT corresponding to the fourth index INDEX4 to which the thirtieth to thirty-ninth logical block addresses LBA30 to LBA39 belong may be '512.' Since the number of times the fortieth to forty-ninth logical block addresses LBA40 to LBA49 are received together with the read request from the host 300 of FIG. 2 is '1024,' the activation count ACTIVE COUNT corresponding to the fifth index INDEX5 to which the fortieth to forty-ninth logical block addresses LBA40 to LBA49 belong may be '1024.'

However, referring to FIG. 4, the logical block address LBA received together with the read request from the host 300 of FIG. 2 may not be any one of the fiftieth to seventy-ninth logical block addresses LBA50 to LBA79. Therefore, each of the activation count ACTIVE COUNT corresponding to the sixth index INDEX6 to which the fiftieth to fifty-ninth logical block addresses LBA50 to LBA59 belong, the activation count ACTIVE COUNT corresponding to the seventh index INDEX7 to which the sixtieth to sixty-ninth logical block addresses LBA60 to LBA69 belong, and the activation count ACTIVE COUNT corresponding to the eighth index INDEX8 to which the seventieth to seventy-ninth logical block addresses LBA70 to LBA79 belong may be '0.' That is, since any of the logical block addresses LBA50 to LBA79 corresponding to the sixth to eighth indices INDEX6 to INDEX8 is not received from the host 300 of FIG. 2, the activation count ACTIVE COUNT corresponding to each of the sixth to eighth indices INDEX6 to INDEX8 may be '0.'

In an embodiment, when the activation count ACTIVE COUNT stored in the address counter 220 of FIG. 2 is equal to or greater than the reference value, the address counter 220 of FIG. 2 may output an activation signal ACTIVE_SIG to the map data selector 230 of FIG. 2. For example, in FIG. 4, when it is assumed that the reference value is '1024,' the activation signal ACTIVE_SIG for outputting map data corresponding to the first to third indices INDEX1 to INDEX3 and the fifth index INDEX5 each having the activation count ACTIVE COUNT that is equal to or greater than the reference value to the host 300 of FIG. 2 may be output to the map data selector 230 of FIG. 2.

The outputting of the activation signal ACTIVE_SIG will be described in more detail with reference to FIG. 5.

Figure 5:
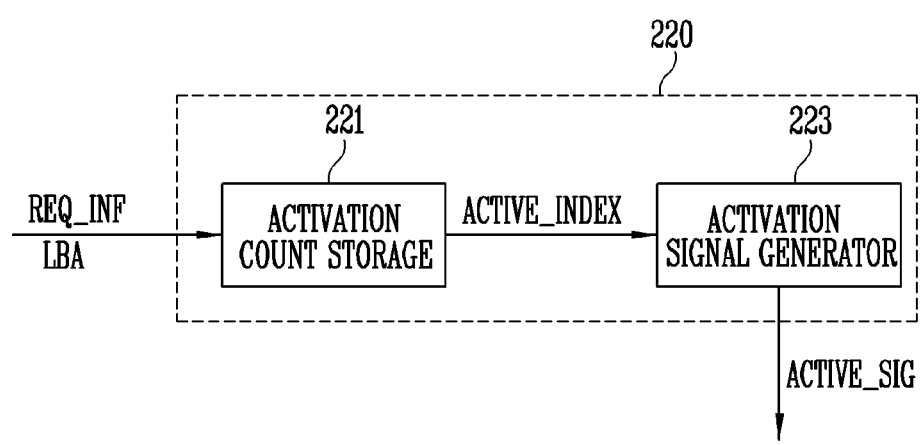
FIG. 5 is a diagram for describing an address counter of FIG. 2 according to an embodiment.

FIG. 5 is a diagram for describing a configuration of the address counter 220 of FIG. 2 according to an embodiment.

Referring to FIG. 5, the address counter 220 may include an activation count storage 221 and an activation signal generator 223.

In an embodiment, the activation count storage 221 may receive the request information REQ_INF and the logical block address LBA from the host interface 210. The request information REQ_INF may indicate the type of the request received from the host 300, and the logical block address LBA may be an address corresponding to the request received from the host 300. The activation count storage 221 may increase or decrease the activation count ACTIVE COUNT corresponding to the index INDEX to which the logical block address LBA belongs, based on the request information REQ_INF, and store the increased or decreased activation count ACTIVE COUNT.

For example, when the request received from the host 300 is the read request, the activation count storage 221 may increase the activation count ACTIVE COUNT of the index INDEX to which the logical block address LBA belongs based on the request information REQ_INF. That is, whenever the request information REQ_INF received from the host interface 210 of FIG. 2 includes information on the read request, the activation count storage 221 may increase the activation count ACTIVE COUNT of the index INDEX to which the logical block address LBA received together with the request information REQ_INF belongs and store the increased activation count ACTIVE COUNT.

On the other hand, when the request received from the host 300 of FIG. 2 is the program (or write) request or the erase request, the activation count storage 221 may decrease the activation count ACTIVE COUNT of the index INDEX to which the logical block address LBA belongs based on the request information REQ_INF. That is, since write data corresponding to the logical block address LBA received together with the program (or write) request from the host 300 of FIG. 2 is not data that is frequently requested by the host 300 of FIG. 2, the activation count ACTIVE COUNT of the corresponding logical block address LBA may be decreased.

In an embodiment, when the increased activation count ACTIVE COUNT becomes equal to or greater than the reference value, the activation count storage 221 may transmit an activation index ACTIVE_INDEX, which is an index corresponding to the increased activation count ACTIVE COUNT, to the activation signal generator 223. That is, in order to output map data MAP_DATA to the host 300 of FIG. 2 since the activation count ACTIVE COUNT becomes equal to or greater than the reference value, the activation count storage 221 may transmit the activation index ACTIVE_INDEX to the activation signal generator 223.

The activation signal generator 223 may generate the activation signal ACTIVE_SIG based on the activation index ACTIVE_INDEX. The activation signal ACTIVE_SIG may be a signal indicating that the activation count ACTIVE COUNT corresponding to the activation index ACTIVE_INDEX becomes equal to or greater than the reference value. Therefore, the activation signal ACTIVE_SIG may indicate that the number of times of the reception of the logical block addresses belonging to the activation index ACTIVE_INDEX is equal to or greater than the reference value, and may indicate that the map data MAP_DATA indicating the mapping relationship between the logical block addresses and corresponding physical block addresses may be output to the host 300 of FIG. 2.

FIG. 6 is a diagram for describing map data transmitted to a host according to an embodiment.

FIG. 6 shows some of the logical block addresses belonging to the first to eighth indices INDEX1 to INDEX8 of FIG. 3 and physical block addresses corresponding to the logical block addresses, respectively.

As shown in FIGS. 3 and 6, the logical block addresses corresponding to the first index INDEX1 may be the 0-th to ninth logical block addresses LBA0 to LBA9, the logical block addresses corresponding to the second index INDEX2 may be the tenth to nineteenth logical block addresses LBA10 to LBA19, the logical block addresses corresponding to the third index INDEX3 may be the twentieth to twenty-ninth logical block addresses LBA20 to LBA29, the logical block addresses corresponding to the fourth index INDEX4 may be the thirtieth to thirty-ninth logical block addresses LBA30 to LBA39, the logical block addresses corresponding to the fifth index INDEX5 may be the fortieth to forty-ninth logical block addresses LBA40 to LBA49, the logical block addresses corresponding to the sixth index INDEX6 may be the fiftieth to fifty-ninth logical block addresses LBA50 to LBA59, the logical block addresses corresponding to the seventh index INDEX7 may be the sixtieth to sixty-ninth logical block addresses LBA60 to LBA69, and the logical block addresses corresponding to the eighth index INDEX8 may be the seventieth to seventy-ninth logical block addresses LBA70 to LBA79.

In addition, it is assumed that the 0-th to seventy-ninth logical block addresses LBA0 to LBA79 correspond to 0-th to seventy-ninth physical block addresses PBA0 to PBA79, respectively.

In an embodiment, first map data MAP_DATA1 may include data indicating a mapping relationship between the 0-th to ninth logical block addresses LBA0 to LBA9 and the 0-th to ninth physical block addresses PBA0 to PBA9, second map data MAP_DATA2 may include data indicating a mapping relationship between the tenth to nineteenth logical block addresses LBA10 to LBA19 and the tenth to nineteenth physical block addresses PBA10 to PBA19, third map data MAP_DATA3 may include data indicating a mapping relationship between the twentieth to twenty-ninth logical block addresses LBA20 to LBA29 and the twentieth to twenty-ninth physical block addresses PBA20 to PBA29, fourth map data MAP_DATA4 may include data indicating a mapping relationship between the thirtieth to thirty-ninth logical block addresses LBA30 to LBA39 and the thirtieth to thirty-ninth physical block addresses PBA30 to PBA39, fifth map data MAP_DATA5 may include data indicating a mapping relationship between the fortieth to forty-ninth logical block addresses LBA40 to LBA49 and the fortieth to forty-ninth physical block addresses PBA40 to PBA49, sixth map data MAP_DATA6 may include data indicating a mapping relationship between the fiftieth to fifty-ninth logical block addresses LBA50 to LBA59 and the fiftieth to fifty-ninth physical block addresses PBA50 to PBA59, seventh map data MAP_DATA7 may include data indicating a mapping relationship between the sixtieth to sixty-ninth logical block addresses LBA60 to LBA69 and the sixtieth to sixty-ninth physical block addresses PBA60 to PBA69, and eighth map data MAP_DATA8 may include data indicating a mapping relationship between the seventieth to seventy-ninth logical block addresses LBA70 to LBA79 and the seventieth to seventy-ninth physical block addresses PBA70 to PBA79.

As a result, the map data corresponding to the first to eighth indices INDEX1 to INDEX8 may be the first to eighth map data MAP_DATA1 to MAP_DATA8, respectively.

In an embodiment, when the number of times of reception of the 0-th to ninth logical block addresses LBA0 to LBA9 together with the read request from the host 300 of FIG. 2 is equal to or greater than the reference value, the map data selector 230 of FIG. 2 may output the first map data MAP_DATA1 to the host 300 of FIG. 2. The reference value may be set in advance.

That is, when the number of times of the reception of logical block addresses corresponding to read data requested by the host 300 of FIG. 2 increases and thus map data of the logical block addresses is required to be transmitted to the host 300, the map data selector 230 of FIG. 2 may output the map data to the host 300.

In an embodiment, when the number of times of reception of the tenth to nineteenth logical block addresses LBA10 to LBA19 together with the read request from the host 300 becomes equal to or greater than the reference value, the map data selector 230 of FIG. 2 may output the second map data MAP_DATA2 to the host 300 of FIG. 2.

As a result, when the number of times of the reception of logical block addresses corresponding to a certain index from the host 300 of FIG. 2 becomes equal to or greater than the reference value, the map data selector 230 of FIG. 2 may output map data of the logical block addresses to the host 300 of FIG. 2.

Figure 7:
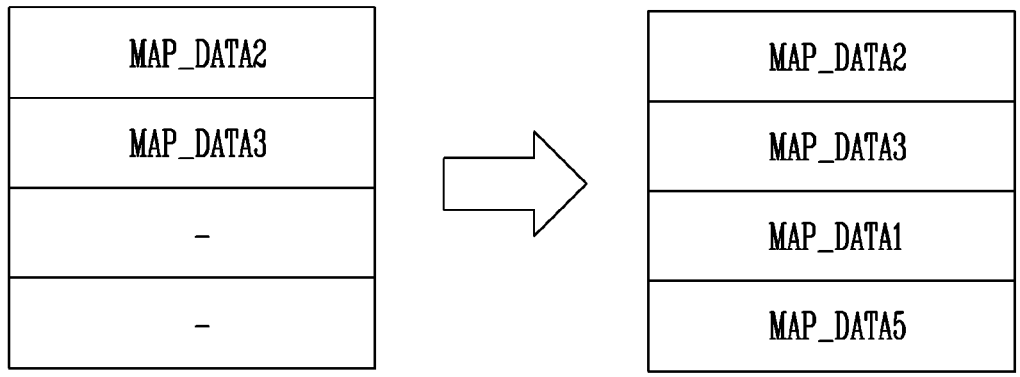
FIG. 7 is a diagram for describing a map data storage that is saturated according to an embodiment.

FIG. 7 is a diagram for describing a map data storage that is saturated according to an embodiment.

FIG. 7 shows the map data storage 310 of FIG. 2 and map data stored in the map data selector 230 of FIG. 2. It is assumed that first to third map data MAP_DATA1 to MAP_DATA3 and fifth map data MAP_DATA5 of FIG. 7 are the same as the first to third map data MAP_DATA1 to MAP_DATA3 and the fifth map data MAP_DATA5 of FIG. 6.

That is, in FIG. 7, the first map data MAP_DATA1 may include data indicating the mapping relationship between the 0-th to ninth logical block addresses LBA0 to LBA9 and the 0-th to ninth physical block addresses PBA0 to PBA9, the second map data MAP_DATA2 may include data indicating the mapping relationship between the tenth to nineteenth logical block addresses LBA10 to LBA19 and the tenth to nineteenth physical block addresses PBA10 to PBA19, the third map data MAP_DATA3 may include data indicating the mapping relationship between the twentieth to twenty-ninth logical block addresses LBA20 to LBA29 and the twentieth to twenty-ninth physical block addresses PBA20 to PBA29, and the fifth map data MAP_DATA5 may include data indicating the mapping relationship between the fortieth to forty-ninth logical block addresses LBA40 to LBA49 and the fortieth to forty-ninth physical block addresses PBA40 to PBA49.

Therefore, map data corresponding to the first index INDEX1 may be the first map data MAP_DATA1, map data corresponding to the second index INDEX2 may be the second map data MAP_DATA2, map data corresponding to the third index INDEX3 may be the third map data MAP_DATA3, and map data corresponding to the fifth index INDEX5 may be the fifth map data MAP_DATA5.

In FIG. 7, it is assumed that the map data selector 230 of FIG. 2 selects the map data to be transmitted to the host 300 of FIG. 2 in order of the second map data MAP_DATA2, the third map data MAP_DATA3, the first map data MAP_DATA1, and the fifth map data MAP_DATA5.

In an embodiment, the map data selector 230 of FIG. 2 may select the map data to be transmitted to the host 300 of FIG. 2 and then store the corresponding map data from the address counter 220. At this time, a size of the stored map data may be determined according to a size of the map data storage 310 of FIG. 2. That is, the map data selector 230 of FIG. 2 may store only map data corresponding to the size of the map data storage 310 of FIG. 2.

In FIG. 7, it is assumed that the map data storage 310 of FIG. 2 may store map data corresponding to four indices.

In an embodiment, referring to FIG. 4, the number of times of the reception of the tenth to nineteenth logical block addresses LBA10 to LBA19 among the logical block addresses received together with the read request from the host 300 may become equal to or greater than the reference value. In this case, the map data selector 230 of FIG. 2 may output the second map data MAP_DATA2 corresponding to the second index INDEX2 to which the tenth to nineteenth logical block addresses LBA10 to LBA19 belong to the host 300 of FIG. 2. Therefore, the map data selector 230 of FIG. 2 may store the second map data MAP_DATA2 and then output the second map data MAP_DATA2 to the host 300 of FIG. 2.

Thereafter, the number of times of reception of the twentieth to twenty-ninth logical block addresses LBA20 to LBA29 received together with the read request from the host 300 of FIG. 2 becomes equal to or greater than the reference value, and the map data selector 230 of FIG. 2 may output the third map data MAP_DATA3 corresponding to the third index INDEX3 to which the twentieth to twenty-ninth logical block addresses LBA20 to LBA29 belong to the host 300 of FIG. 2. Therefore, the map data selector 230 of FIG. 2 may store the third map data MAP_DATA3 and then output the third map data MAP_DATA3 to the host 300 of FIG. 2.

After the second and third map data MAP_DATA2 and MAP_DATA3 are output to the host 300 of FIG. 2, the number of times of reception of the 0-th to ninth logical block addresses LBA0 to LBA9 received with the read request from the host 300 of FIG. 2 and the number of times of reception of the fortieth to forty-ninth logical block addresses LBA40 to LBA49 may become equal to or greater than the reference value. Therefore, the map data selector 300 of FIG. 2 may store the first and fifth map data MAP_DATA1 and MAP_DATA5 and then output the first and fifth map data MAP_DATA1 and MAP_DATA5 to the host 300 of FIG. 2.

However, after the first to third map data MAP_DATA1 to MAP_DATA3 and the fifth map data MAP_DATA5 are stored in the map data selector 230 of FIG. 2 and the map data storage 310 of FIG. 2, the map data storage 310 of FIG. 2 may not store another map data anymore because storage sizes of the map data storage 310 are limited. In this case, the map data selector 230 of FIG. 2 may select map data to be stored in the map data storage 310 of FIG. 2 again.

In an embodiment, a method of selecting map data again by the map data selector 230 of FIG. 2 includes selecting the map data again after scanning a deactivation index.

The above-described method will be described in more detail with reference to FIG. 8.

Figure 8:
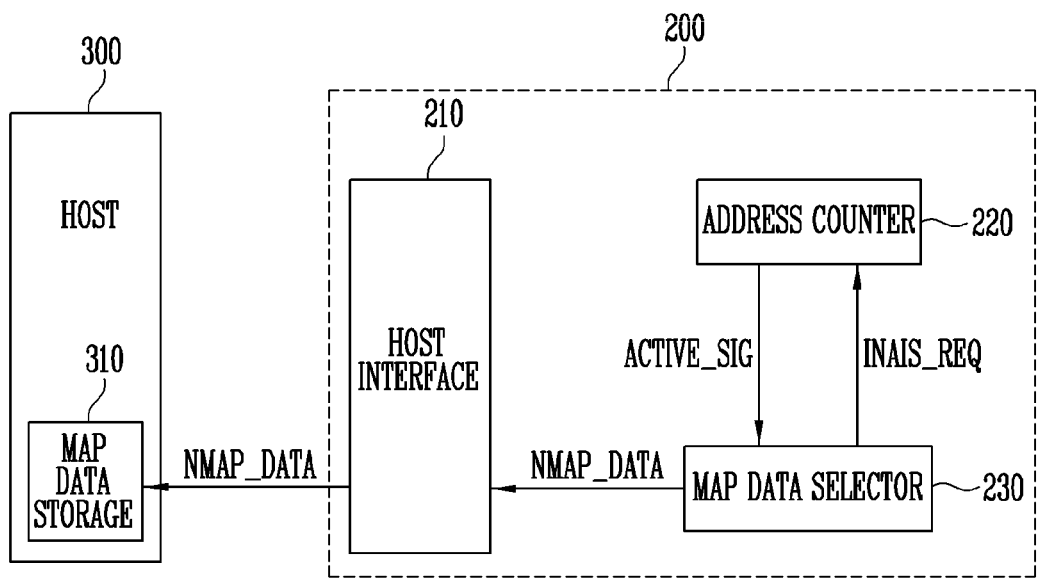
FIG. 8 is a diagram for describing an operation of a memory controller when a map data storage is in a saturation state according to an embodiment.

FIG. 8 is a diagram for describing an operation of a memory controller when a map data storage is in a saturation state according to an embodiment. The memory controller and the map data storage of FIG. 8 may correspond to the memory controller 200 and the map data storage 310 shown in FIG. 2, respectively.

Referring to FIG. 8, the memory controller 200 may include the host interface 210, the address counter 220, and the map data selector 230, and the host 300 may include the map data storage 310.

FIG. 8 shows a method of selecting new map data NMAP_DATA to be output to the host 300 after map data MAP_DATA corresponding to the size of the map data storage 310 of FIG. 7 is stored in the map data storage 310, that is, when the map data storage 310 is in the saturation state.

In an embodiment, since the map data storage 310 is saturated and thus the map data storage 310 may not store another map data anymore, the map data selector 230 may transmit a deactivation index scan request INAIS_REQ to the address counter 220. A deactivation index scan operation corresponding to the deactivation index scan request INAIS_REQ may be an operation for detecting, as an deactivation index, an index corresponding to an activation count ACTIVE COUNT that is less than the reference value. The reference value may be set in advance.

For example, the deactivation index scan operation may be an operation for detecting an index of which the number of times of the reception of logical block addresses LBA received together with the read request from the host 300 does not reach the reference value, or becomes equal to or greater than the reference value and then becomes less than the reference value again. A deactivation index and an activation index may be distinguished from each other through the deactivation index scan operation.

The address counter 220 may detect the deactivation index based on the stored activation count ACTIVE COUNT and then output an activation signal ACTIVE_SIG. The activation signal ACTIVE_SIG may be a signal indicating an activation index having an activation count ACTIVE COUNT that is equal to or greater than the reference value.

In an embodiment, after determining the activation index based on the activation signal ACTIVE_SIG newly received from the address counter 220, the map data selector 230 may select the new map data NMAP_DATA corresponding to the activation index and output the newly selected map data NMAP_DATA to the host 300. Specifically, the map data selector 230 may transfer the new map data NMAP_DATA to the map data storage 310 in the host 300 through the host interface 210. Therefore, the map data storage 310 may store the new map data NMAP_DATA.

However, when a size of map data MAP_DATA indicated by the activation signal ACTIVE_SIG output from the address counter 220 exceeds the capacity of the map data storage 310, the map data selector 230 may not output the new map data NMAP_DATA to the host 300. Therefore, the map data selector 230 may continuously perform the deactivation index scan operation in order to select the new map data NMAP_DATA that can be output to the host 300.

Since operation efficiency of the storage device may be decreased when the deactivation index scan operation is continuously performed, the map data selector 230 is required to perform an operation of selecting the new map data NMAP_DATA to be output to the host 300 before scanning the deactivation index. This operation may include an operation of decreasing an activation count ACTIVE COUNT corresponding to an index.

The operation performed by the map data selector 230 when the map data storage 310 is saturated will be described in more detail with reference to FIGS. 9 to 13.

Figure 9:
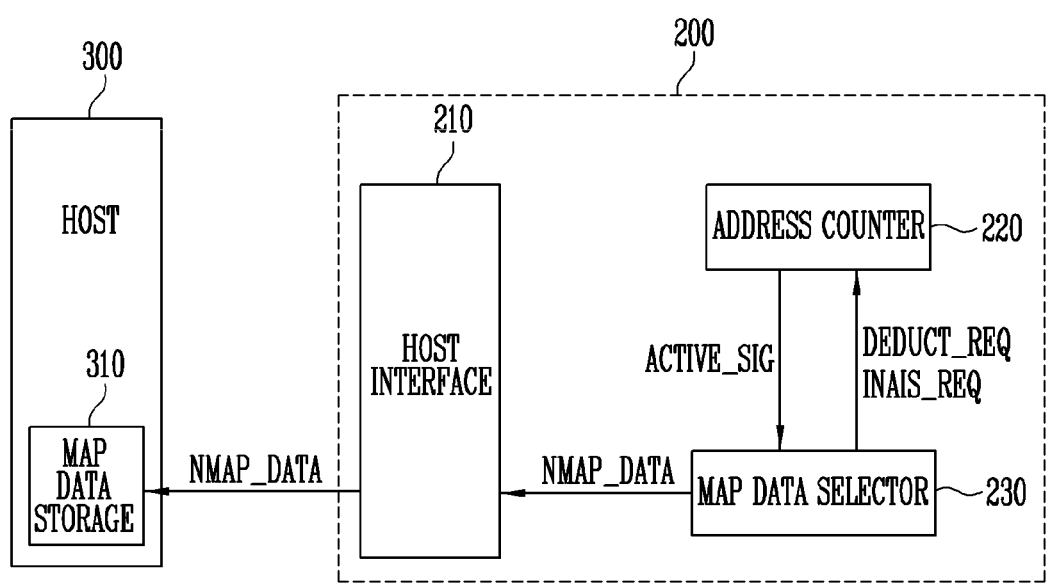
FIG. 9 is a diagram for describing an operation of a memory controller when a deactivation index is not detected according to an embodiment.

FIG. 9 is a diagram for describing an operation of a memory controller when a deactivation index is not detected according to an embodiment. The memory controller of FIG. 9 may correspond to the memory controller 200 shown in FIG. 8.

FIG. 9 shows an operation that is performed by the memory controller 200 when the size of the map data MAP_DATA corresponding to the activation signal ACTIVE_SIG received from the address counter 220 of FIG. 8 after the deactivation index scan operation described with reference to FIG. 8 is performed exceeds the capacity of the map data storage 310.

In an embodiment, the map data selector 230 may output a decrease request DEDUCT_REQ to the address counter 220. The decrease request DEDUCT_REQ may be a request to decrease an activation count ACTIVE COUNT corresponding to an index.

A method of decreasing the activation count ACTIVE COUNT will be described in detail with reference to FIGS. 10 to 13. In the present specification, four methods for decreasing the activation count ACTIVE COUNT are presented, but embodiments are not limited thereto.

In an embodiment, when the map data selector 230 outputs the decrease request DEDUCT_REQ to the address counter 220, the address counter 220 may decrease the activation count ACTIVE COUNT corresponding to the index. Thereafter, the map data selector 230 may output the deactivation index scan request INAIS_REQ to the address counter 220 in order to select the new map data NMAP_DATA to be output to the host 300 again based on the decreased activation count ACTIVE COUNT.

The address counter 220 may determine whether the decreased activation count ACTIVE COUNT corresponding to the index becomes less than the reference value in response to the deactivation index scan request INAIS_REQ received from the map data selector 230. In particular, the address counter 220 may scan the indices stored therein to detect an index that becomes a deactivation index among the indices corresponding to the map data MAP_DATA stored in the map data storage 310.

Therefore, the map data selector 230 may output the deactivation index scan request INAIS_REQ to the address counter 220, and the address counter 220 may output the activation signal ACTIVE_SIG indicating the activation index after performing the deactivation index scan operation in response to the deactivation index scan request INAIS_REQ. At this time, when the size of the map data MAP_DATA corresponding to the activation index is equal to or less than the size of the map data storage 310, the map data selector 230 may output the map data MAP_DATA corresponding to the activation index as the new map data NMAP_DATA to the host 300 through the host interface 210. Thereafter, the map data storage 310 may store the new map data NMAP_DATA output from the map data selector 230.

However, when the size of the map data MAP_DATA corresponding to the activation index is greater than the size of the map data storage 310, the map data selector 230 may output the decrease request DEDUCT_REQ to the address counter 220 again. That is, the map data selector 230 may output the decrease request DEDUCT_REQ to the address counter 220 until the size of the map data MAP_DATA corresponding to the activation index is equal to or less than the size of the map data storage 310.

Thereafter, when the size of the map data MAP_DATA corresponding to the activation index is equal to or less than the size of the map data storage 310, the map data storage 310 may store, as the new map data NMAP_DATA, the map data MAP_DATA corresponding to the activation index that is output from the map data selector 230.

Figure 10:
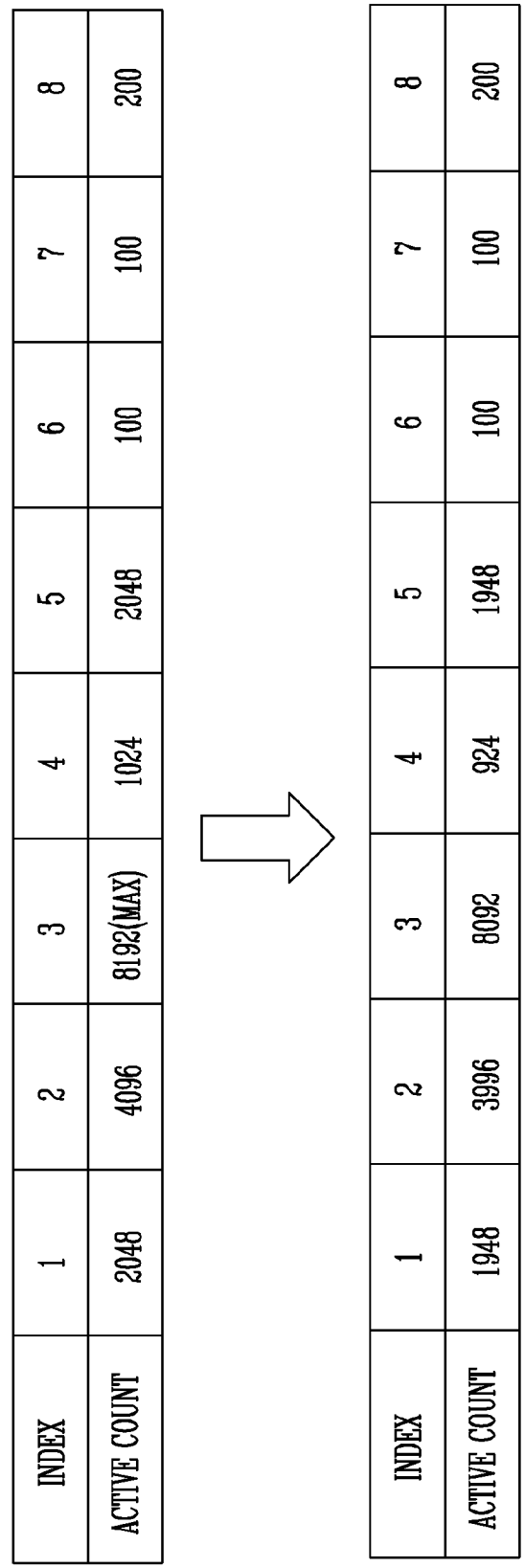
FIG. 10 is a diagram for describing a method of decreasing an activation count according to a first embodiment.

FIG. 10 is a diagram for describing a method of decreasing an activation count according to a first embodiment.

Referring to FIGS. 3, 9, and 10, an activation count ACTIVE COUNT corresponding to each index INDEX is decreased based on the decrease request DEDUCT_REQ received from the map data selector 230 of FIG. 9. It is assumed that each index INDEX of FIG. 10 is the same as a corresponding one of the indices shown in FIG. 3.

In FIG. 10, it is assumed that the reference value of the activation count ACTIVE COUNT is '1024,' and the number of map data that can be stored in the map data storage 310 of FIG. 9 is '4.' In addition, it is assumed that a maximum value MAX of the activation count ACTIVE COUNT corresponding to each index INDEX is '8192.'

In FIG. 10, the third index INDEX3 corresponding to the maximum activation count '8192,' the second index INDEX2 corresponding to the activation count '4096,' the first and fifth indices INDEX1 and INDEX5 corresponding to the activation count ACTIVE COUNT '2048,' and the fourth index INDEX4 corresponding to the activation count ACTIVE COUNT '1024' may sequentially become activation indices.

Therefore, FIG. 10 shows a state after the first to third map data MAP_DATA1 to MAP_DATA3 respectively corresponding to the first to third indices INDEX1 to INDEX3 and the fifth map data MAP_DATA5 corresponding to the fifth index INDEX5 are stored in the map data selector 230 of FIG. 9 and the map data storage 310 of FIG. 9.

In an embodiment, after the first to third map data MAP_DATA1 to MAP_DATA3 and the fifth map data MAP_DATA5 are stored in the map data storage 310 of FIG.

9, the map data selector 230 of FIG. 9 may select new map data to be stored in the map data storage 310 of FIG. 9 based on the activation signal ACTIVE SIG received from the address counter 220 of FIG. 9. However, since four map data corresponding to the size of the map data storage 310 are already stored in the map data storage 310 of FIG. 9, the new map data cannot be stored in the map data storage 310. Therefore, the map data storage 310 of FIG. 9 may require the deactivation index scan operation for detecting an index changed to a deactivation index among the activation indices corresponding to the first to third map data MAP_DATA1 to MAP_DATA3 and the fifth map data MAP_DATA5 that are stored in the map data storage 310.

However, when the deactivation index is not detected even though the deactivation index scan operation is performed, the map data selector 230 of FIG. 9 may output the decrease request DEDUCT_REQ to the address counter 220 of FIG. 9, and the address counter 220 of FIG. 9 may decrease the activation count ACTIVE COUNT corresponding to the index INDEX in response to the decrease request DEDUCT_REQ.

In FIG. 10, since the address counter 220 of FIG. 9 may not detect the deactivation index through the deactivation index scan operation, the address counter 220 of FIG. 9 may decrease the activation count ACTIVE COUNT in response to the decrease request DEDUCT_REQ.

In an embodiment, after receiving the decrease request DEDUCT_REQ, the address counter 220 may decrease the activation count ACTIVE COUNT by 100. At this time, an activation count of a deactivation index, which is an activation index having an activation count ACTIVE COUNT that is less than '1024,' may not be decreased. That is, the activation count ACTIVE COUNT may be set based on recent tendency of provision of the read request of the host 300 of FIG. 9 and adjusted by only decreasing the activation count ACTIVE COUNT of the activation index.

For example, in FIG. 10, the activation counts ACTIVE COUNT of the first to fifth indices INDEX1 to INDEX5 that are the activation indices may be decreased by 100, and the activation counts ACTIVE COUNT of the sixth to eighth indices INDEX6 to INDEX8 that are the deactivation indices may be maintained as they are without being decreased.

Therefore, after the address counter 220 decreases the activation counts ACTIVE COUNT of the indices in response to the decrease request DEDUCT_REQ, the activation count ACTIVE COUNT of the first index INDEX1 may be '1948,' the activation count ACTIVE COUNT of the second index INDEX2 may be '3996,' the activation count ACTIVE COUNT of the third index INDEX3 may be '8092,' the activation count ACTIVE COUNT of the fourth index INDEX4 may be '924,' the activation count ACTIVE COUNT of the fifth index INDEX5 may be '1948,' the activation count ACTIVE COUNT of the sixth index INDEX6 may be '100,' the activation count ACTIVE COUNT of the seventh index INDEX7 may be '100,' and the activation count ACTIVE COUNT of the eighth index INDEX8 may be '200.'

As a result, the activation count ACTIVE COUNT may be decreased in response to the decrease request DEDUCT_REQ received from the map data selector 230 of FIG. 9, and then the map data selector 230 of FIG. 9 may output the deactivation index scan request INAIS_REQ to the address counter 220 of FIG. 9 again.

In FIG. 10, after the activation counts ACTIVE COUNT are decreased, the indices corresponding to the activation counts ACTIVE COUNT equal to or greater than the reference value, i.e.,'1024,' may be the first to third indices INDEX1 to INDEX3 and the fifth index INDEX5. Therefore, the map data selector 230 of FIG. 9 may select the first to third map data MAP_DATA1 to MAP_DATA3 respectively corresponding to the first to third indices INDEX1 to INDEX3 and the fifth map data MAP_DATA5 corresponding to the fifth index INDEX5 as new map data to be output to the host 300 of FIG. 9. Thereafter, the map data selector 230 of FIG. 9 may store the first to third map data MAP_DATA1 to MAP_DATA3 and the fifth map data MAP_DATA5, and output those map data to the map data storage 310 of FIG. 9 through the host interface 210 of FIG. 9.

However, in the above case, since the newly selected map data, i.e., the first to third map data MAP_DATA1 to MAP_DATA3 and the fifth map data MAP_DATA5, is the same as the map data stored in the map data storage 310 of FIG. 9, the map data selector 230 of FIG. 9 may output only a signal indicating that the selection of the new map data is completed (not shown) without performing an operation of selecting the new map data.

That is, when the activation count ACTIVE COUNT is decreased in response to the decrease request DEDUCT_REQ, the map data to be output to the host 300 of FIG. 9 may be selected again, and the selected map data may be output to the host 300 of FIG. 9 or the signal indicating that the selection of the map data is completed may be output to the host 300 of FIG. 9.

Figure 11:
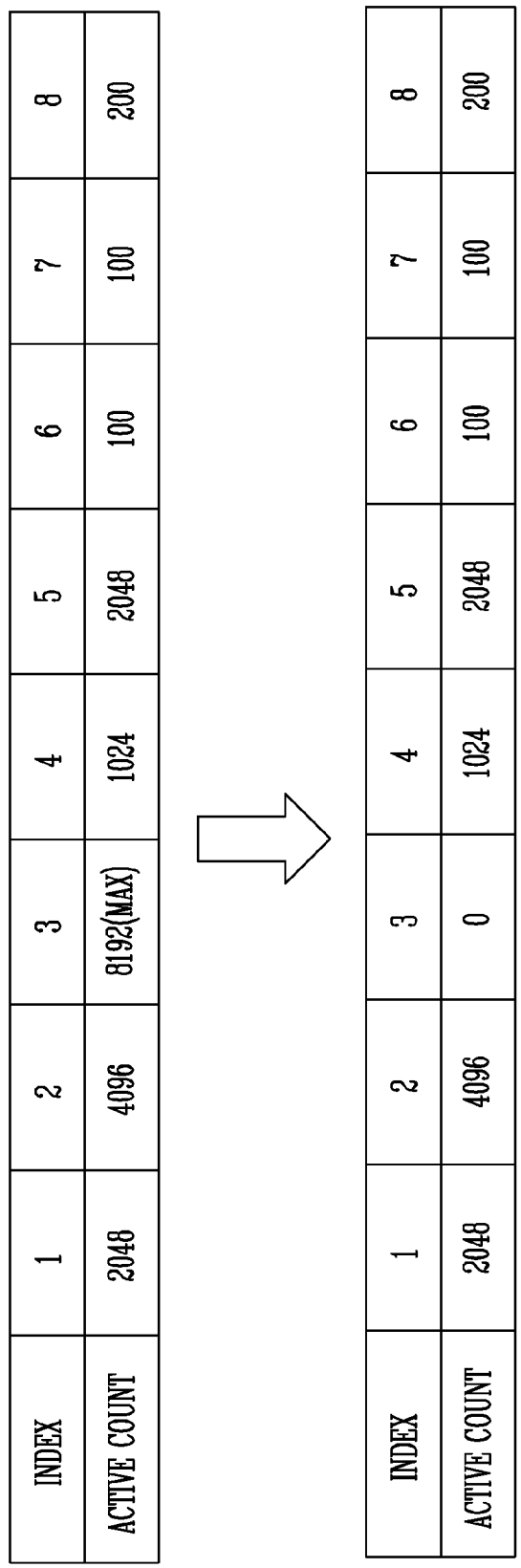
FIG. 11 is a diagram for describing a method of decreasing an activation count according to a second embodiment.

FIG. 11 is a diagram for describing a method of decreasing an activation count according to a second embodiment.

In FIG. 11, the activation count ACTIVE COUNT corresponding to each index INDEX is decreased in response to the decrease request DEDUCT_REQ received from the map data selector 230 of FIG. 9.

Similarly to FIG. 10, FIG. 11 shows a process in which the activation count ACTIVE COUNT is decreased when the size of the map data selected by the map data selector 230 of FIG. 9 exceeds the size of the map data storage 310 of FIG. 9 and when the deactivation index is not detected by the deactivation index scan operation.

In an embodiment, it is assumed that the memory controller 200 of FIG. 9 receives any one of the logical block addresses LBA20 to LBA29 belonging to the third index INDEX3 through the host interface 210 of FIG. 9 together with the program (or write) request or the erase request from the host 300 of FIG. 9. Since the request received from the host 300 of FIG. 9 is not the read request, a mapping relationship between any one of the logical block addresses LBA20 to LBA29 belonging to the third index INDEX3 and a corresponding physical block address may be newly formed.

Therefore, since the third index INDEX3 does not include a logical block address corresponding to data frequently requested by the host 300 of FIG. 9, the third index INDEX3 may become a deactivation index. Since the third index INDEX3 is now the deactivation index, the address counter 220 of FIG. 9 may decrease the activation count ACTIVE COUNT of the third index INDEX3 to '0.' That is, the activation count ACTIVE COUNT corresponding to the third index INDEX3 may be decreased from '8192 (MAX)' to '0.'

However, the activation counts ACTIVE COUNT of the remaining indices except for the third index INDEX3 may maintain the existing values. That is, the activation count ACTIVE COUNT of the first index INDEX1 may be '2048,' the activation count ACTIVE COUNT of the second index INDEX2 may be '4096,' the activation count ACTIVE COUNT of the fourth index INDEX4 may be '1024,' the activation count ACTIVE COUNT of the fifth index INDEX5 may be '2048,' the activation count ACTIVE COUNT of the sixth index INDEX6 may be '100,' the activation count ACTIVE COUNT of the seventh index INDEX7 may be '100,' and the activation count ACTIVE COUNT of the eighth index INDEX8 may be '200.'

As a result, the method of FIG. 11 decreases the activation count ACTIVE COUNT of the index that is changed to the deactivation index from the activation index, and maintains the activation counts ACTIVE COUNT of the remaining indices as the existing values.

Therefore, the activation count ACTIVE COUNT may be decreased in response to the decrease request DEDUCT_REQ received from the map data selector 230 of FIG. 9, and then the map data selector 230 of FIG. 9 may output the deactivation index scan request INAIS_REQ to the address counter 220 of FIG. 9 again.

In FIG. 11, after the activation count ACTIVE COUNT of the third index INDEX3 is decreased, the indices corresponding to the activation counts ACTIVE COUNT equal to or greater than '1024' that is the reference value may be the first and second indices INDEX1 and INDEX2 and the fourth and fifth indices INDEX4 and INDEX5. Therefore, the map data selector 230 of FIG. 9 may select the first and second map data MAP_DATA1 and MAP_DATA2 respectively corresponding to the first and second indices INDEX1 and INDEX2 and the fourth and fifth map data MAP_DATA4 and MAP_DATA5 respectively corresponding to the fourth and fifth indices INDEX4 and INDEX5 as the new map data to be output to the host 300 of FIG. 9.

The map data selector 230 of FIG. 9 may store the first and second map data MAP_DATA1 and MAP_DATA2 and the fourth and fifth map data MAP_DATA4 and MAP_DATA5 and then output those map data to the map data storage 310 of FIG. 9 through the host interface 210 of FIG. 9.

In an embodiment, the map data storage 310 of FIG. 9 may store the first and second map data MAP_DATA1 and MAP_DATA2 and the fourth and fifth map data MAP_DATA4 and MAP_DATA5, which are newly selected by the map data selector 230 of FIG. 9, instead of previously stored map data.

FIG. 12 is a diagram for describing a method of decreasing an activation count according to a third embodiment.

In FIG. 12, an activation count ACTIVE COUNT corresponding to each index INDEX is decreased in response to the decrease request DEDUCT_REQ received from the map data selector 230 of FIG. 9.

Similarly to FIG. 11, FIG. 12 shows a process in which the activation count ACTIVE COUNT is decreased when the size of the map data selected by the map data selector 230 of FIG. 9 exceeds the size of the map data storage 310 of FIG. 9 and when the deactivation index is not detected by the deactivation index scan operation.

In an embodiment, it is assumed that the memory controller 200 of FIG. 9 receives any one of the logical block addresses LBA20 to LBA29 belonging to the third index INDEX3 through the host interface 210 of FIG. 9 together with the program (or write) request or the erase request from the host 300 of FIG. 9. Since the request received from the host 300 of FIG. 9 is not the read request, a mapping relationship between any one of the logical block addresses LBA20 to LBA29 belonging to the third index INDEX3 and a corresponding physical block address may be newly formed.

Therefore, since the third index INDEX3 does not include a logical block address corresponding to data frequently requested by the host 300 of FIG. 9, the third index INDEX3 may become a deactivation index. Since the third index INDEX3 is now the deactivation index, the address counter 220 of FIG. 9 may decrease the activation count ACTIVE COUNT of the third index INDEX3 to '0.' That is, the activation count ACTIVE COUNT corresponding to the third index INDEX3 may be decreased from '8192 (MAX)' to '0.'

In FIG. 11, the activation counts ACTIVE COUNT corresponding to the remaining indices except for the third index INDEX3 are maintained as the existing values. However, in FIG. 12, the activation counts ACTIVE COUNT corresponding to the remaining indices except for the third index INDEX3 may be decreased by 50% from the existing values. That is, in order to prevent the activation counts ACTIVE COUNT from being excessively increased, the activation counts ACTIVE COUNT corresponding to the remaining indices may be decreased.

For example, the activation count ACTIVE COUNT of the first index INDEX1 may be '1024' that is decreased by 50% from '2048,' the activation count ACTIVE COUNT of the second index INDEX2 may be '2048' that is decreased by 50% from '4096,' the activation count ACTIVE COUNT of the fourth index INDEX4 may be '512' that is decreased by 50% from '1024,' the activation count ACTIVE COUNT of the fifth index INDEX5 may be '1024' that is decreased by 50% from '2048,' the activation count ACTIVE COUNT of the sixth index INDEX6 may be '50' that is decreased by 50% from '100,' the activation count ACTIVE COUNT of the seventh index INDEX7 may be '50' that is decreased by 50% from '100,' and the activation count ACTIVE COUNT of the eighth index INDEX8 may be '100' that is decreased by 50% from '200.'

Therefore, the activation count ACTIVE COUNT may be decreased in response to the decrease request DEDUCT_REQ received from the map data selector 230 of FIG. 9, and then the map data selector 230 of FIG. 9 may output the deactivation index scan request INAIS_REQ to the address counter 220 of FIG. 9 again.

In FIG. 12, after the activation count ACTIVE COUNT of the third index INDEX3 is decreased, the indices corresponding to the activation counts ACTIVE COUNT equal to or greater than the reference value '1024' that is the reference value are the first, second, and fifth indices INDEX1, INDEX2, and INDEX5. Therefore, the map data selector 230 of FIG. 9 may select the first, second, and fifth map data MAP_DATA1, MAP_DATA2, and MAP_DATA5 respectively corresponding to the first, second, and fifth indices INDEX1, INDEX2, and INDEX5 as the new map data to be output to the host 300 of FIG. 9. Therefore, the map data selector 230 of FIG. 9 may store the first, second, and fifth map data MAP_DATA1, MAP_DATA2, and MAP_DATA5, and then output those map data to the map data storage 310 of FIG. 9 through the host interface 210 of FIG. 9.

In an embodiment, the map data storage 310 of FIG. 9 may store the first, second, and fifth map data MAP_DATA1, MAP_DATA2, and MAP_DATA5 that are newly selected by the map data selector 230 of FIG. 9 instead of previously stored map data.

Figure 13:
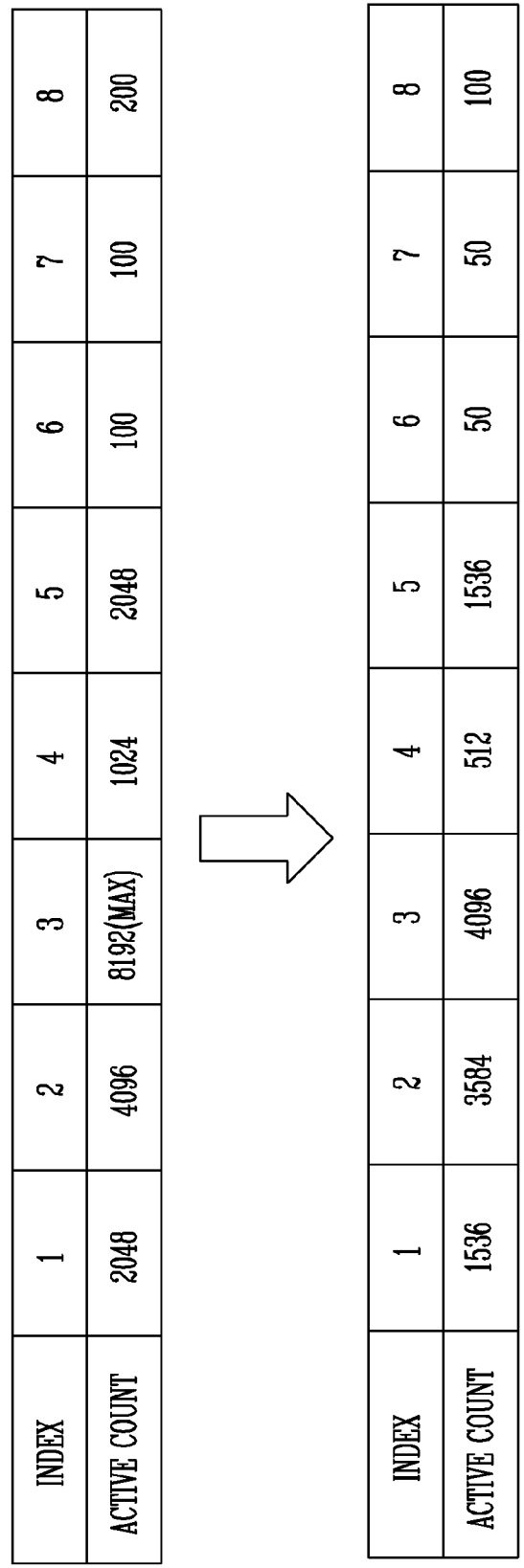
FIG. 13 is a diagram for describing a method of decreasing an activation count according to a fourth embodiment.

FIG. 13 is a diagram for describing a method of decreasing an activation count according to a fourth embodiment.

Similarly to FIG. 10, FIG. 13 shows a process in which the activation count ACTIVE COUNT is decreased when the size of the map data selected by the map data selector 230 of FIG. 9 exceeds the size of the map data storage 310 of FIG. 9 and when the deactivation index is not detected by the deactivation index scan operation.

In an embodiment, it is assumed that the memory controller 200 of FIG. 9 receives any one of the logical block addresses LBA20 to LBA29 belonging to the third index INDEX3 through the host interface 210 of FIG. 9 together with the program (or write) request or the erase request from the host 300 of FIG. 9. Since the request received from the host 300 of FIG. 9 is not the read request, a mapping relationship between any one of the logical block addresses LBA20 to LBA29 belonging to the third index INDEX3 and a corresponding physical block address may be newly formed.

Therefore, since the third index INDEX3 does not include a logical block address corresponding to data frequently requested by the host 300 of FIG. 9, the third index INDEX3 may be changed from the activation index to a deactivation index.

However, differently from FIGS. 11 and 12, the activation count ACTIVE COUNT of the third index INDEX3 may be decreased to 50% of the existing value. That is, the activation count ACTIVE COUNT corresponding to the third index INDEX3 may be decreased from '8192' to '4096.'

However, the activation counts ACTIVE COUNT of the remaining indices except for the third index INDEX3 may be decreased to different sizes according to the existing values. For example, in FIG. 13, when the activation count ACTIVE COUNT is equal to or greater than '1024,' the activation count ACTIVE COUNT may be decreases by '512' from the existing value, and when the activation count ACTIVE COUNT is less than '1024,' the activation count ACTIVE COUNT may be decreased to 50% of the existing value.

Therefore, since the activation count ACTIVE COUNT of the first index INDEX1 is '2048' that is greater than '1024,' the activation count ACTIVE COUNT of the first index INDEX1 may become '1536' that is decreased from '2048' by '512' Since the activation count ACTIVE COUNT of the second index INDEX2 is '4906' that is greater than '1024,' the activation count ACTIVE COUNT of the second index INDEX2 may become '3584' that is decreased from '4096' by '512' Since the activation count ACTIVE COUNT of the fourth index INDEX4 is '1024' that is equal to '1024,' the activation count ACTIVE COUNT of the fourth index INDEX4 may become '512' that is decreased from '1024' by '512.' Since the activation count ACTIVE COUNT of the fifth index INDEX5 is '2048' that is greater than '1024,' the activation count ACTIVE COUNT of the fifth index INDEX5 may become '1536' that is decreased from '2048' by '512.' Since the activation count ACTIVE COUNT of the sixth index INDEX6 is '100' that is less than '1024,' the activation count ACTIVE COUNT of the sixth index INDEX6 may become '50' that is decreased from '100' by 50%. Since the activation count ACTIVE COUNT of the seventh index INDEX7 is '100' that is less than '1024,' the activation count ACTIVE COUNT of the seventh index INDEX7 may become '50' that is decreased from '100' by 50%. Since the activation count ACTIVE COUNT of the eighth index INDEX8 is '200' that is less than '1024,' the activation count ACTIVE COUNT of the eighth index INDEX8 may become '100' that is decreased from '200' by 50%.

The activation count ACTIVE COUNT may be decreased in response to the decrease request DEDUCT_REQ received from the map data selector 230 of FIG. 9, and then the map data selector 230 of FIG. 9 may output the deactivation index scan request INAIS_REQ to the address counter 220 of FIG. 9 again.

In FIG. 13, after the activation counts ACTIVE COUNT for the first to eighth indices INDEX1 to INDEX8 are decreased, the indices corresponding to the activation counts ACTIVE COUNT equal to or greater than '1024' that is the reference value may be the first to third indices INDEX1 to INDEX3 and the fifth index INDEX5. Therefore, the map data selector 230 of FIG. 9 may select the first to third map data MAP_DATA1 to MAP_DATA3 respectively corresponding to the first to third indices INDEX1 to INDEX3 and the fifth map data MAP_DATA5 corresponding to the fifth index INDEX5 as the new map data to be output to the host 300 of FIG. 9.

The map data selector 230 of FIG. 9 may store the first to third map data MAP_DATA1 to MAP_DATA3 and the fifth map data MAP_DATA5, and then output those map data to the map data storage 310 of FIG. 9 through the host interface 210 of FIG. 9.

However, in another embodiment, as describe with reference to FIG. 10, since the newly selected map data is the same as the existing map data stored in the map data storage 310 of FIG. 9, the map data selector 230 of FIG. 9 may output only a signal indicating that the selection of the map data is completed without performing an operation of selecting new map data.

Figure 14:
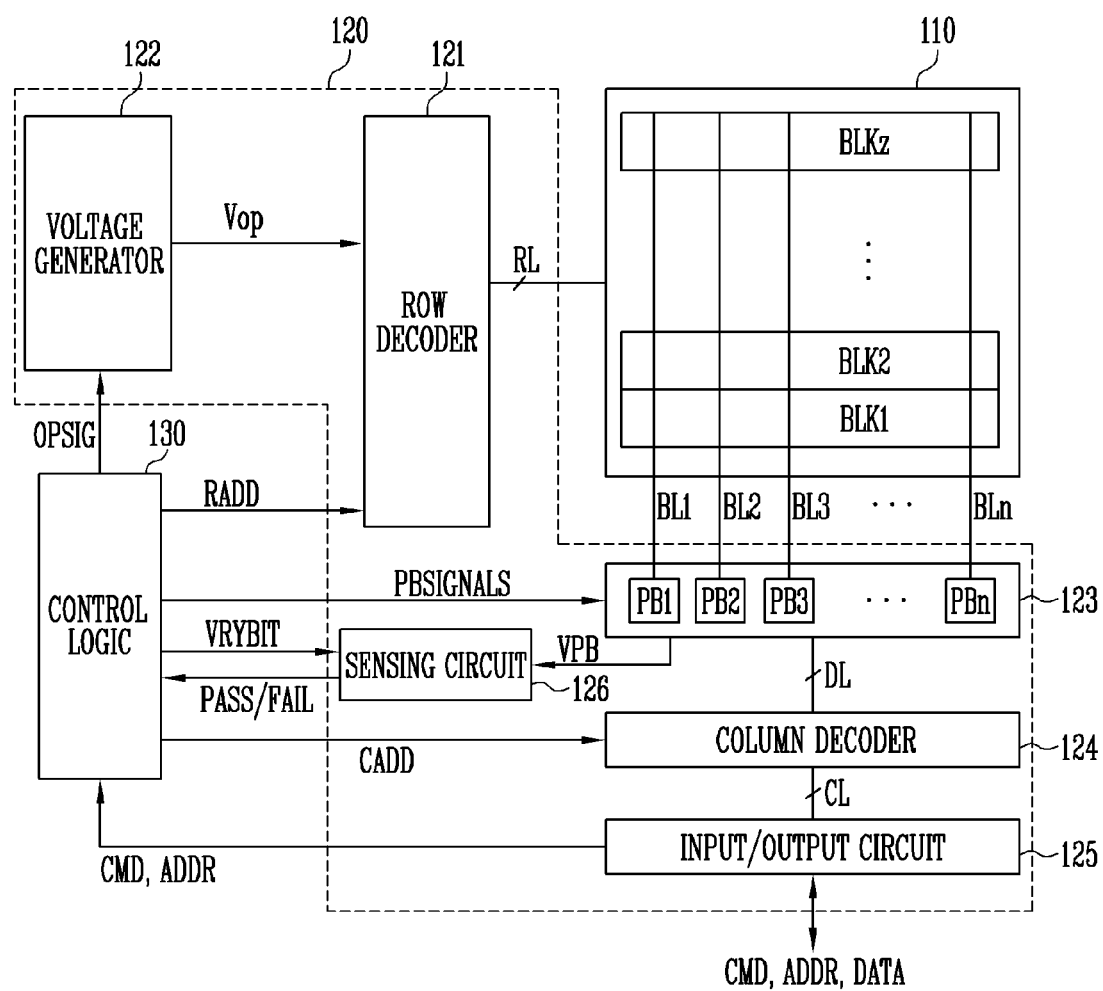
FIG. 14 is diagram for describing a structure of a memory device of FIG. 1.

FIG. 14 is diagram for describing a structure of a memory device. The memory device of FIG. 14 may correspond to the memory device 100 of FIG. 1.

Referring to FIG. 14, the memory device 100 may include a memory cell array 110, a peripheral circuit 120, and a control logic 130.

The memory cell array 110 includes a plurality of memory blocks BLK1 to BLKz, z being a positive integer. The plurality of memory blocks BLK1 to BLKz are connected to a row decoder 121 through row lines RL. The plurality of memory blocks BLK1 to BLKz may be connected to a page buffer group 123 through bit lines BL1 to BLn, n being a positive integer. Each of the plurality of memory blocks BLK1 to BLKz includes a plurality of memory cells. In an embodiment, the plurality of memory cells are non-volatile memory cells. Memory cells connected to the same word line may be defined as a page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one bit of data, a multi-level cell (MLC) that stores two bits of data, a triple level cell (TLC) that stores three bits of data, or a quadruple level cell (QLC) that stores four bits of data.

The peripheral circuit 120 may be configured to perform a program operation, a read operation, or an erase operation on a selected memory region of the memory cell array 110 under the control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the selected memory block according to the decoded address and apply the operation voltages generated by the voltage generator 122 to the selected word line WL.

For example, during the program operation, the row decoder 121 may apply a program voltage to the selected word line WL and apply a program pass voltage to an unselected word line. The program pass voltage has a lower level than the program voltage. During a program verify operation, the row decoder 121 may apply a verify voltage to the selected word line WL and a verify pass voltage to the unselected word line. The verify pass voltage has a higher level than the verify voltage. During the read operation, the row decoder 121 may apply a read voltage to the selected word line WL and apply a read pass voltage to the unselected word line. The read pass voltage has a higher level than the read voltage.

In an embodiment, the erase operation of the memory device 100 is performed in a memory block unit. During the erase operation, the row decoder 121 may select one memory block according to the decoded address. During the erase operation, the row decoder 121 may apply a ground voltage to word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop to be used in the program, read, and erase operations, in response to an operation signal OPSIG. For example, the voltage generator 122 may generate the program voltage, the program pass voltage, the verify voltage, the verify pass voltage, the read voltage, the read pass voltage, an erase voltage, and the like in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages in response to the control of the control logic 130.

The plurality of voltages generated by the voltage generator 122 may be supplied to the memory cell array 110 through the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or program verify operation.

Specifically, during the program operation, when the program voltage is applied to the selected word line WL, the first to n-th page buffers PB1 to PBn may transfer data DATA received through the input/output circuit 125 to the memory cells of the selected page through the first to n-th bit lines BL1 to BLn. The memory cells of the selected page are programmed according to the transferred data DATA. During the program verify operation, the first to n-th page buffers PB1 to PBn may read data of the memory cells of the selected page by sensing the voltage or the current received from the memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under the control of the column decoder 124.

During the erase operation, the first to n-th page buffers PB1 to PBn may float the first to n-th bit lines BL1 to BLn or apply the erase voltage to the first to n-th bit lines BL1 to BLn.

The column decoder 124 may transfer data between the input/output circuit 125 and the page buffer group 123 based on a column address CADD. For example, the column decoder 124 may exchange data with the first to n-th page buffers PB1 to PBn through data lines DL, or may exchange data with the input/output circuit 125 through column lines CL.

The input/output circuit 125 may transfer a command CMD and an address ADDR received from the memory controller 200 of FIG. 1 to the control logic 130, or may exchange data DATA with the column decoder 124.

The sensing circuit 126 may generate a reference current in response to a permission bit signal VRYBIT during the read operation or the program verify operation, and compare a sensing voltage VPB received from the page buffer group 123 with a reference voltage generated by the reference current to thereby output a pass signal PASS or a fail signal FAIL.

The control logic 130 may output the operation signal OPSIG, the row address RADD, the column address CADD, the page buffer control signals PBSIGNALS, and the permission bit signal VRYBIT based on the command CMD and the address ADDR in order to control the peripheral circuit 120. For example, the control logic 130 may control a read operation of a selected memory block in response to a sub block read command and the address ADDR. In addition, the control logic 130 may control an erase operation of a selected sub block included in the selected memory block in response to a sub block erase command and the address ADDR. In addition, the control logic 130 may determine whether a program verify operation has passed or failed in response to the pass or fail signal PASS or FAIL.

Each of the memory cells included in the memory cell array 110 may be programmed to any one of a plurality of program states according to data stored in each of the memory cells. A target program state of a selected memory cell may be determined as any one of the plurality of program states according to data to be stored in the selected memory cell.

Figure 15:
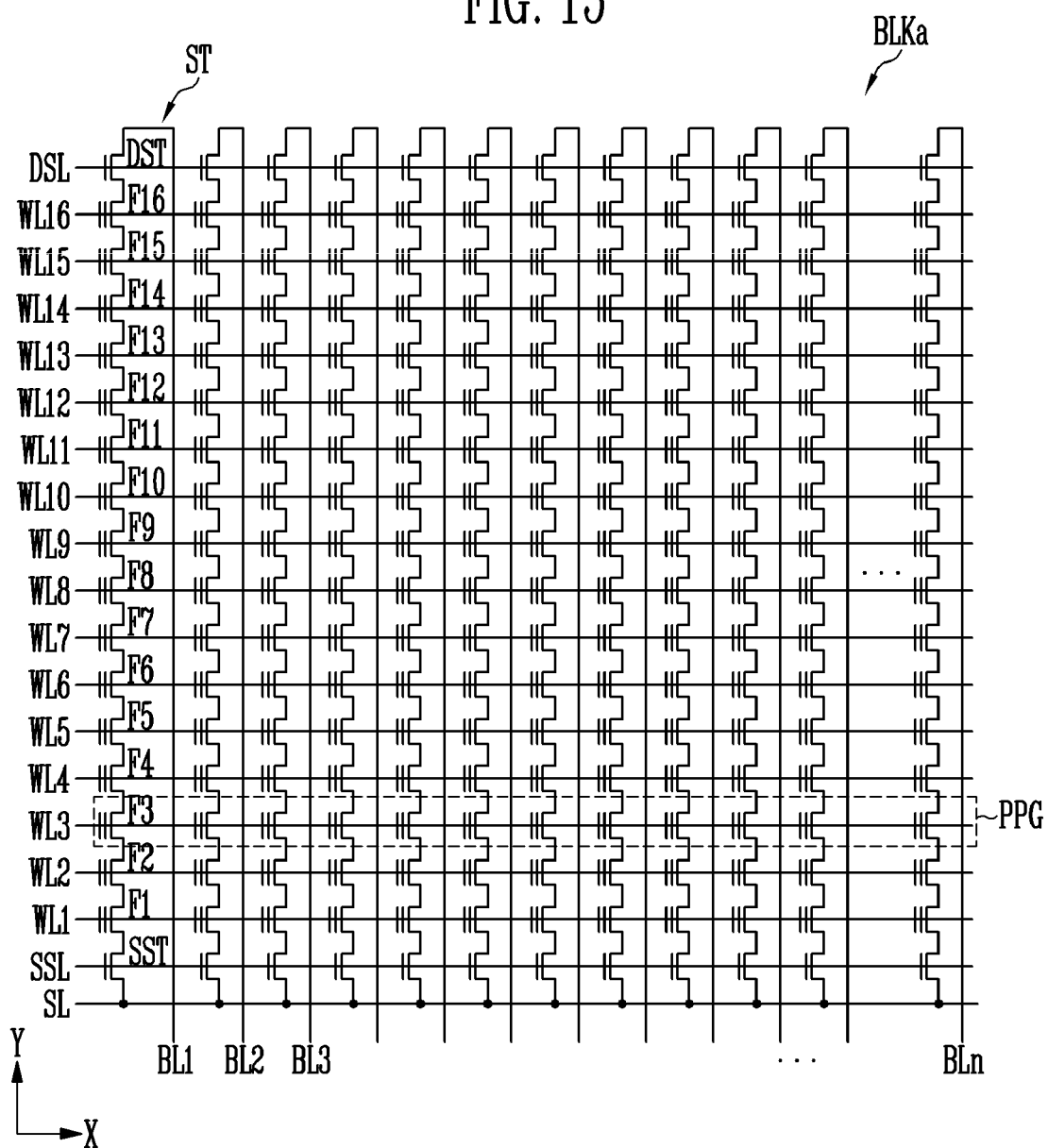
FIG. 15 is a diagram for describing a memory block.

FIG. 15 is a diagram for describing a memory block. The memory block of FIG. 15 may correspond to any one memory block BLKa among the plurality of memory blocks BLK1 to BLKz included in the memory cell array 110 of FIG. 14.

A first select line, word lines, and a second select line arranged in parallel with each other may be connected to the memory block BLKa. For example, the word lines may be arranged in parallel with each other between the first and second select lines. Here, the first select line may be a source select line SSL, and the second select line may be a drain select line DSL.

More specifically, the memory block BLKa may include a plurality of strings ST connected between the bit lines BL1 to BLn and a source line SL. The bit lines BL1 to BLn may be connected to the strings ST, respectively, and the source line SL may be commonly connected to the strings ST. Since the strings ST may have the same configuration, a string ST connected to the first bit line BL1 will be specifically described, as an example.

Referring to FIG. 15, the string ST may include a source select transistor SST, a plurality of memory cells F1 to F16, and a drain select transistor DST that are connected in series between the source line SL and the first bit line BL1. In other embodiments, one string ST may include at least one source select transistor SST and at least one drain select transistor DST, and may include a plurality of memory cells that are more than the memory cells F1 to F16.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings may be commonly connected to the source select line SSL, gates of drain select transistors DST included in the different strings may be commonly connected to the drain select line DSL, and gates of the memory cells F1 to F16 may be connected to a plurality of word lines WL1 to WL16, respectively. A group of the memory cells connected to the same word line among the memory cells included in the different strings may be referred to as a physical page PPG. Therefore, the memory block BLKa may include the plurality of physical pages PPG corresponding to the word lines WL1 to WL16.

One memory cell may store one bit of data. This is commonly referred to as a single level cell (SLC). In this case, one physical page PPG may store data of one logical page LPG. The data of one logical page LPG may include a plurality of bits that correspond to the number of memory cells included in one physical page PPG. In another embodiment, one memory cell may store two or more bits of data. This is commonly referred to as a multi-level cell (MLC). In this case, one physical page PPG may store data of two or more logical pages LPG.

A memory cell storing two or more bits of data is referred to as a multi-level cell (MLC), but recently, as the number of bits of data stored in one memory cell increases, the multi-level cell (MLC) refers to a memory cell storing two bits of data. A memory cell storing three or more bits of data is referred to as a triple level cell (TLC), and a memory cell storing four or more bits of data is referred to as a quadruple level cell (QLC). A method of storing a plurality of bits of data in a memory cell has been developed, but the present embodiment may be applied to the memory device 100 in which two or more bits of data are stored in a memory cell.

In another embodiment, a memory block may have a three-dimensional structure. The memory block includes a plurality of memory cells stacked on a substrate in a vertical direction perpendicular to a surface of the substrate. In still another embodiment, a plurality of memory cells may be arranged along an X direction, a Y direction, and a Z direction that are perpendicular to each other.

Figure 16:
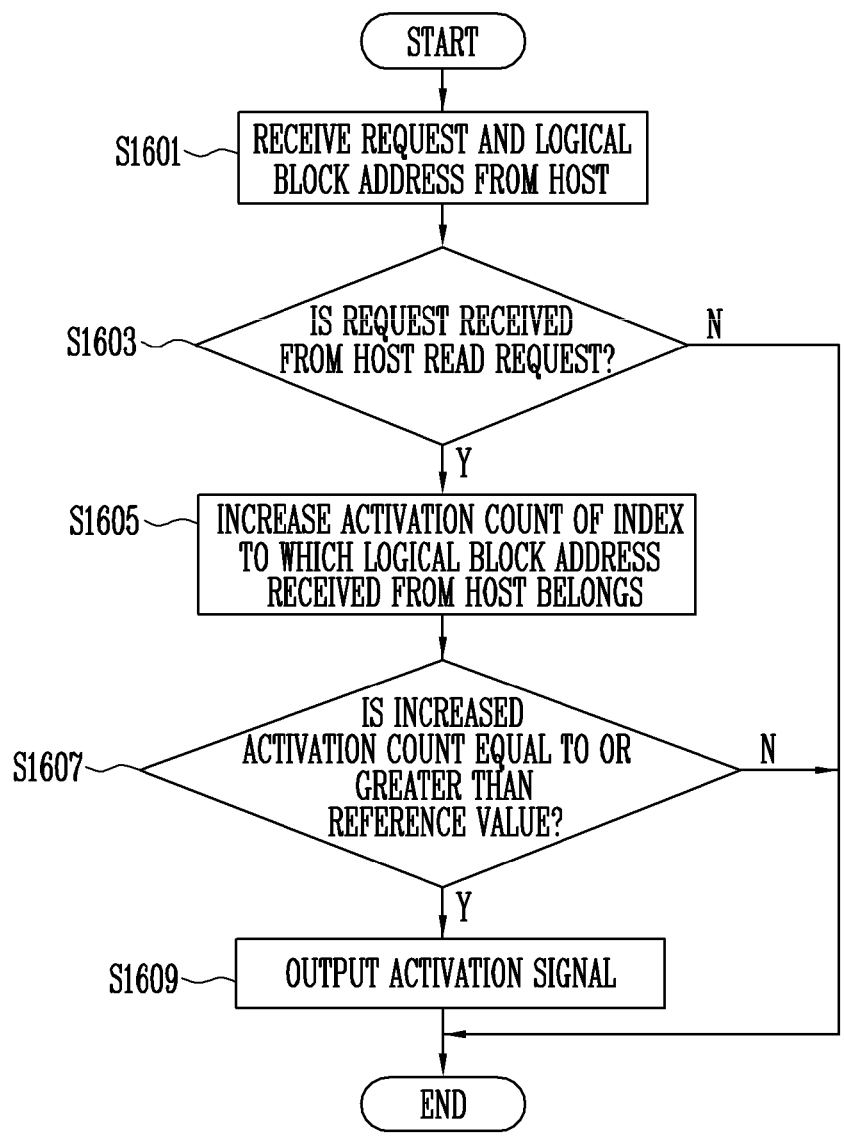
FIG. 16 is a diagram for describing an operation of a memory controller according to an embodiment of the present disclosure.

FIG. 16 is a diagram for describing an operation of a memory controller according to an embodiment of the present disclosure.

Referring to FIG. 16, at S1601, the memory controller may receive a request and a logical block address from a host. The logical block address received from the host may be an address corresponding to the request.

In an embodiment, the logical block address corresponding to a specific memory region may be frequently received together with a read request from the host. That is, the host may call data stored in the specific memory region several times. For example, any of 0-th to ninth logical block addresses may be received many times from the host compared to other logical block addresses.

In this case, map data indicating a mapping relationship between the logical block address and a corresponding physical block address may be stored in the host in order to omit the mapping conversion of a flash translation layer FTL in the memory controller. Therefore, an operation speed of a storage device including the memory controller may be improved.

Therefore, whenever the memory controller receives the request from the host, the memory controller may determine whether the request received from the host is the read request at S1603. When the request received from the host is the read request (Y), at S1605, the memory controller may increase an activation count of an index to which the logical block address received from the host belongs. That is, whenever the memory controller receives the read request and the logical block address corresponding to the read request from the host, the memory controller may increase the activation count of the index to which the logical block address belongs.

After increasing the activation count of the index to which the logical block address belongs, the memory controller may determine whether the increased activation count is equal to or greater than a reference value at S1607. The reference value may be set in advance.

When the increased activation count is equal to or greater than the reference value (Y), in order to store map data corresponding to the index in the host, the memory controller may output an activation signal at S1609. The activation signal indicates that the activation count corresponding to the index is equal to or greater than the reference value.

Figure 17:
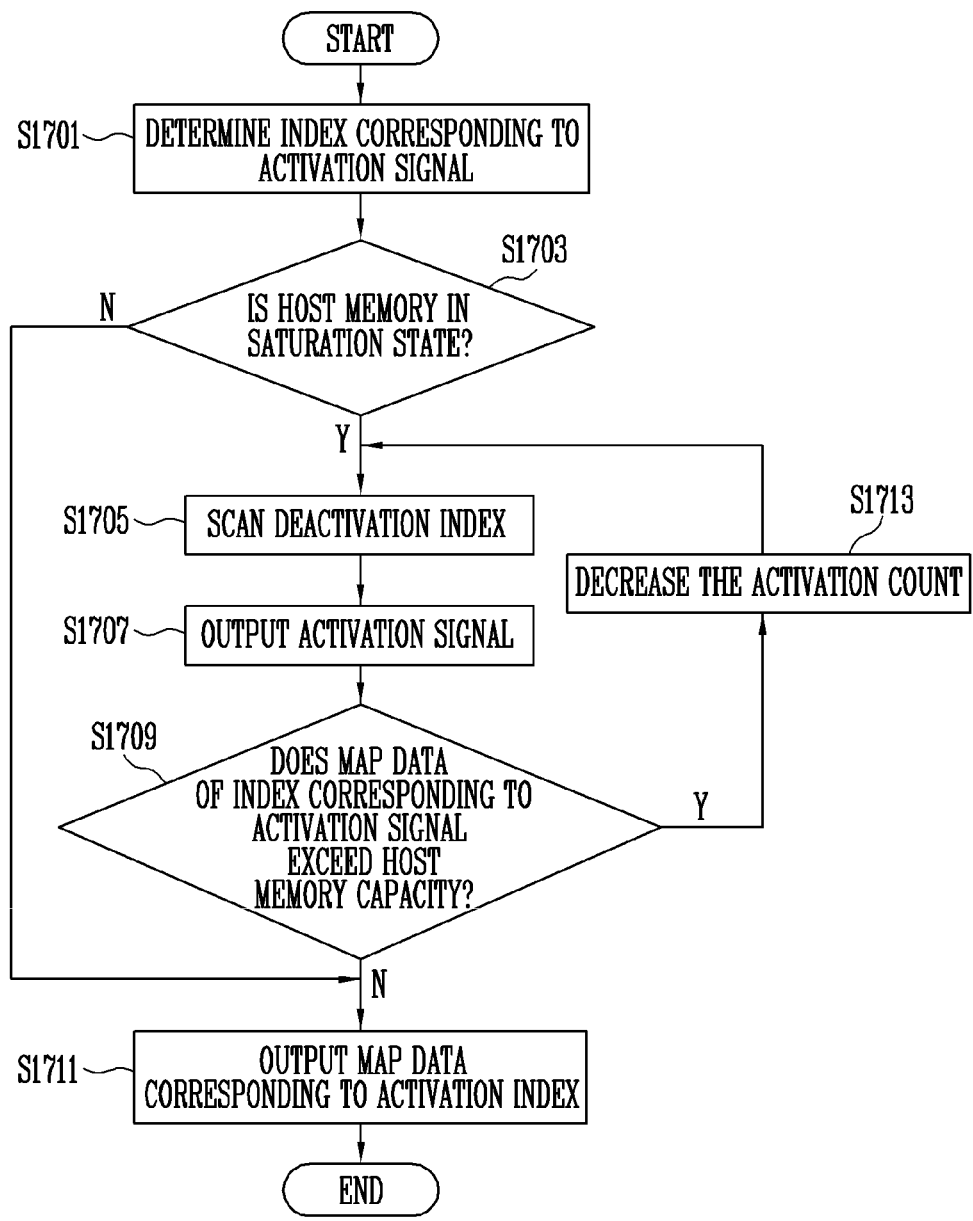
FIG. 17 is a diagram for describing an operation of the memory controller according to an embodiment of the present disclosure.

FIG. 17 is a diagram for describing an operation of the memory controller according to an embodiment of the present disclosure.

Referring to FIGS. 16 and 17, S1701 to S1713 of FIG. 17 show processes following S1609 of FIG. 16.

At S1701, the memory controller may determine the index corresponding to the activation signal. That is, since the activation signal is a signal for indicating that the activation count corresponding to the index is equal to or greater than the reference value, the memory controller may determine, as an activation index, the index corresponding to the activation count equal to or greater than the reference value based on the activation signal.

When the index corresponding to the activation count equal to or greater than the reference value is determined as the activation index, the memory controller may determine whether map data stored in the host is in a saturation state at S1703. That is, it may be determined by checking whether an amount of the map data stored in the host reaches the capacity of a host memory in the host.

In an embodiment, when the amount of the map data does not reach the capacity of the host memory (N), since the map data can be stored in the host memory, the memory controller may output the map data corresponding to the activation index to the host at S1711.

However, when it is determined at S1703 that the map data stored in the host reaches the capacity of the host memory, that is, when the host memory is in the saturation state (Y), the memory controller may perform a deactivation index scan operation at S1705. An index corresponding to an activation count that becomes less than the reference value among activation counts corresponding to indices of the memory controller may be detected, as a deactivation index, through the deactivation index scan operation.

After performing the deactivation index scan operation at S1705, the memory controller may output an activation signal indicating activation indices again at S1707. However, map data of the indices corresponding to the activation signal that is output again may exceed the capacity of the host memory. Therefore, the memory controller may determine whether the map data of the indices corresponding to the activation signal exceeds the capacity of the host memory at S1709.

In an embodiment, when the map data of the index corresponding to the activation signal does not exceed the capacity of the host memory (N), the memory controller may output the map data corresponding to the activation signal to the host at S1711. However, when the map data of the indices corresponding to the activation signal exceeds the capacity of the host memory (Y), the memory controller may decrease one or more of the activation counts corresponding to the indices of the memory controller in order to select map data output to the host again at S1713. The method of decreasing the activation count has been described above with reference to FIGS. 10 to 13.

After the memory controller decreases the activation counts at S1713, the process proceeds to S1705 again and thus the memory controller may perform the deactivation index scan operation for outputting the map data to the host. That is, the memory controller may continuously perform an operation of decreasing the activation counts and scanning the deactivation index until the map data to be stored in the host memory may be selected.

Figure 18:
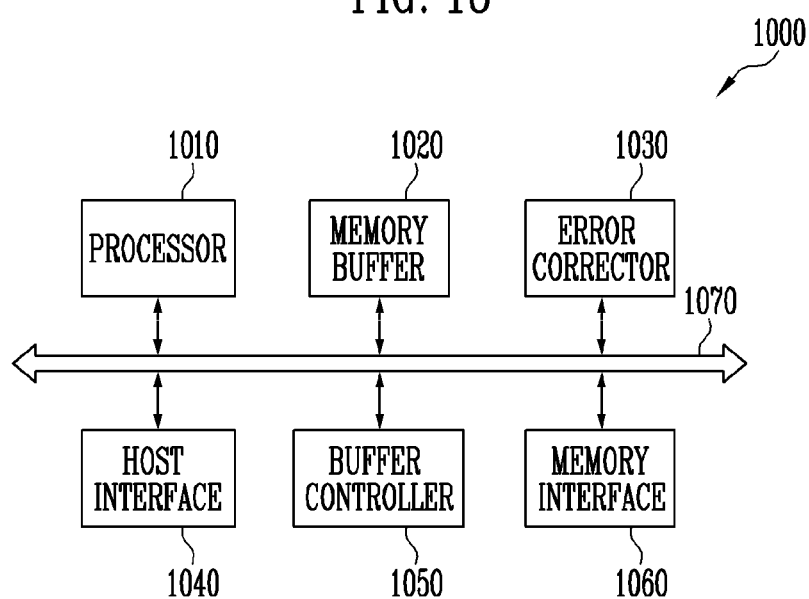
FIG. 18 is a diagram for describing the memory controller of FIG. 1 according to another embodiment.

FIG. 18 is a diagram for describing a memory controller 1000 according to an embodiment. The memory controller 1000 may correspond to the memory controller 200 of FIG. 1.

The memory controller 1000 is connected to a host and a memory device. The memory controller 1000 is configured to access the memory device in response to a request from the host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 18, the memory controller 1000 may include a processor 1010, a memory buffer 1020, an error corrector (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with the host through the host interface 1040 and communicate with the memory device through the memory interface 1060. In addition, the processor 1010 may communicate with the memory buffer 1020 through the buffer controller 1050. The processor 1010 may control an operation of a storage device including the memory controller 1000 using the memory buffer 1020.

The processor 1010 may perform a function of a flash translation layer (FTL). The processor 1010 may convert a logical block address (LBA) provided by the host into a physical block address (PBA) through the flash translation layer (FTL). The flash translation layer (FTL) may receive the logical block address (LBA) and convert the logical block address (LBA) into the physical block address (PBA) using a mapping table. An address mapping method of the flash translation layer includes a plurality of mapping methods according to a mapping unit. A representative address mapping method includes a page mapping method, a block mapping method, and a hybrid mapping method.

The processor 1010 may increase an activation count corresponding to an index to which a logical block address received together with a read request from the host belongs. In addition, when the activation count is equal to or greater than a reference value, the processor 1010 may output map data corresponding to the index to the host.

However, since the number of map data that can be stored in the host is limited, when the map data stored in the host is in a saturation state, the processor 1010 may decrease the activation count corresponding to the index. A method of decreasing the activation count may be various.

Thereafter, the processor 1010 may distinguish a deactivation index and an activation index through a deactivation index scan operation. When the number of map data corresponding to the activation indices is equal to or less than the number of map data, which can be stored in the host, the processor 1010 may output the map data corresponding to the activation indices to the host.

The processor 1010 is configured to randomize data received from the host. For example, the processor 1010 may randomize the data received from the host using a randomizing seed. The randomized data is provided to the memory device as data to be stored and is programmed into a memory cell array of the memory device.

The processor 1010 may perform the data randomization and data de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error corrector 1030 may perform error correction. The error corrector 1030 may perform error correction encoding (ECC encoding) on data that is to be written to the memory device. The error correction encoded data may be transferred to the memory device through the memory interface 1060. The error corrector 1030 may perform error correction decoding (ECC decoding) on data received from the memory device through the memory interface 1060. For example, the error corrector 1030 may be included in the memory interface 1060 as a component of the memory interface 1060.

The host interface 1040 is configured to communicate with the host under the control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection express (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM). Please replace paragraph [0270] with the following amended paragraph:

The memory controller 2100 and the memory device 2200 may be integrated into one semiconductor device to configure a memory card such as a PC card (e.g., personal computer memory card international association (PCMCIA) card), a compact flash (CF) card, a smart media card (e.g., SM or SMC), a memory stick, a multimedia card (e.g., MMC, RS-MMC, MMCmicro, or eMMC), an SD card (e.g., SD, miniSD, microSD, or SDHC), a universal flash storage (UFS), or the like.

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In another embodiment, the memory controller 1000 may not include the memory buffer 1020 and the buffer controller 1050.

For example, the processor 1010 may control the operation of the memory controller 1000 using codes. In an embodiment, the processor 1010 may load the codes from a non-volatile memory device (for example, a read only memory) provided inside the memory controller 1000. In another embodiment, the processor 1010 may load the codes from the memory device through the memory interface 1060.

For example, the bus 1070 of the memory controller 1000 may be divided into a control bus and a data bus. The data bus may be configured to transmit data within the memory controller 1000, and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the error corrector 1030, and the memory interface 1060. The control bus may be connected to the host interface 1040, the processor 1010, the buffer controller 1050, the memory buffer 1020, and the memory interface 1060.

Figure 19:
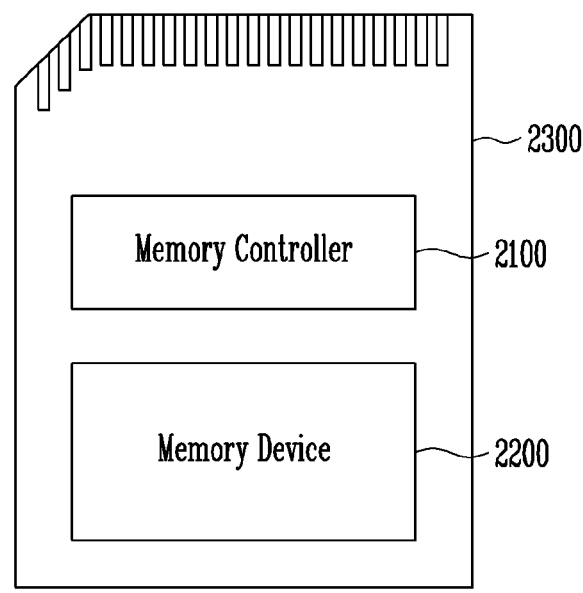
FIG. 19 is a block diagram illustrating a memory card system to which the storage device according to an embodiment of the present disclosure is applied.

FIG. 19 is a block diagram illustrating a memory card system 2000 to which a storage device according to an embodiment of the present disclosure is applied.

Referring to FIG. 19, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory device 2200 may be implemented with the memory device 100 of FIG. 1.

As an example, the memory controller 2100 may include components such as a random access memory (RAM), a processor, a host interface, a memory interface, and an error corrector.

The memory controller 2100 may communicate with an external device such as the host through the connector 2300 according to a specific communication standard. For example, the memory controller 2100 is configured to communicate with the external device through at least one of various communication standards such as a universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. Therefore, the connector 2300 may be defined by at least one of the various communication standards described above.

For example, the memory device 2200 may be implemented as any of various non-volatile memory devices such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card such as a PC card (e.g., personal computer memory card international association (PCMCIA)), a compact flash card (CF), a smart media card (e.g., SM or SMC), a memory stick, a multimedia card (e.g., MMC, RS-MMC, MMCmicro, or eMMC), an SD card (e.g., SD, miniSD, microSD, or SDHC), a universal flash storage (UFS), or the like.

In an embodiment, the memory controller 2100 may increase an activation count corresponding to an index to which a logical block address received together with a read request from the host belongs. In addition, when the activation count is equal to or greater than a reference value, the memory controller 2100 may output map data corresponding to the index to the host.

However, since the number of map data that can be stored in the host is limited, when map data stored in the host is in a saturation state, the memory controller 2100 may decrease the activation count corresponding to the index. A method of decreasing the activation count may be various.

Thereafter, the memory controller 2100 may distinguish a deactivation index and an activation index through a deactivation index scan operation. When the number of map data corresponding to the activation indices is equal to or less than the number of map data, which can be stored in the host, the memory controller 2100 may output the map data corresponding to the activation indices to the host.

Figure 20:
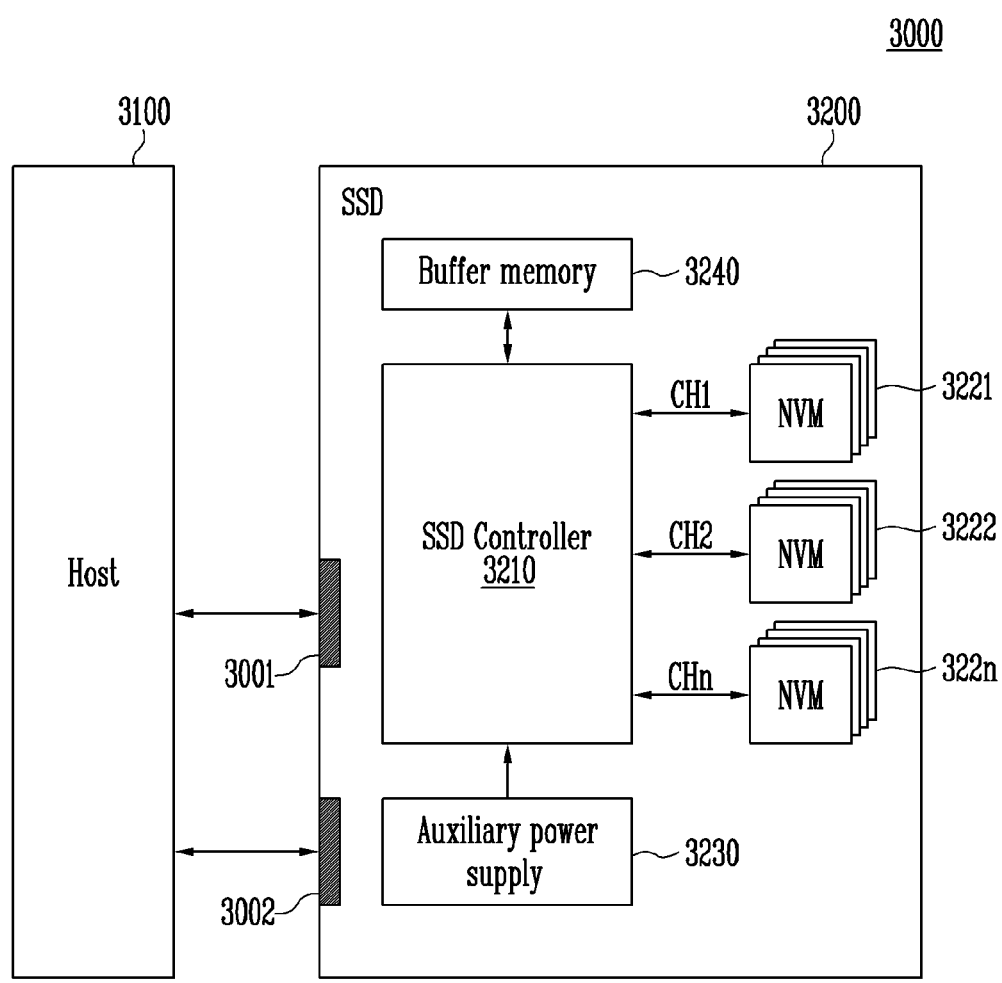
FIG. 20 is a block diagram exemplary illustrating a solid state drive (SSD) system to which the storage device according to an embodiment of the present disclosure is applied.

FIG. 20 is a block diagram illustrating a solid state drive (SSD) system 3000 to which a storage device according to an embodiment of the present disclosure is applied.

Referring to FIG. 20, the SSD system 3000 includes a host 3100 and an SSD 3200. The SSD 3200 exchanges a signal SIG with the host 3100 through a signal connector 3001 and receives power PWR from the host 3100 through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may be implemented with the memory controller 200 of FIG. 1.

The SSD controller 3210 may control the plurality of flash non-volatile memories 3221 to 322n in response to the signal SIG received from the host 3100. For example, the signal SIG may include signals based on an interface between the host 3100 and the SSD 3200. For example, the signal SIG may include a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

In an embodiment, the SSD controller 3210 may increase an activation count corresponding to an index to which a logical block address received together with a read request from the host 3100 belongs. In addition, when the activation count is equal to or greater than a reference value, the SSD controller 3210 may output map data corresponding to the index to the host 3100.

However, since the number of map data that can be stored in the host 3100 is limited, when map data stored in the host 3100 is in a saturation state, the SSD controller 3210 may decrease the activation count corresponding to the index. A method of decreasing the activation count may be various.

Thereafter, the SSD controller 3210 may distinguish a deactivation index and an activation index through a deactivation index scan operation. When the number of map data corresponding to the activation indices is equal to or less than the number of map data, which can be stored in the host 3100, the SSD controller 3210 may output the map data corresponding to the activation indices to the host 3100.

The auxiliary power supply 3230 is connected to the host 3100 through the power connector 3002. The auxiliary power supply 3230 may receive the power PWR from the host 3100. The auxiliary power supply 3230 may provide the power PWR to the SSD 3200 when power supply from the host 3100 is not smooth. For example, the auxiliary power supply 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of non-volatile memories 3221 to 322n, or may temporarily store metadata (for example, a mapping table) of the non-volatile memories 3221 to 322n. The buffer memory 3240 may include a volatile memory such as a DRAM, an SDRAM, a DDR SDRAM, an LPDDR SDRAM, or a GRAM, or a non-volatile memory such as an FRAM, a ReRAM, an STT-MRAM, or a PRAM.

Figure 21:
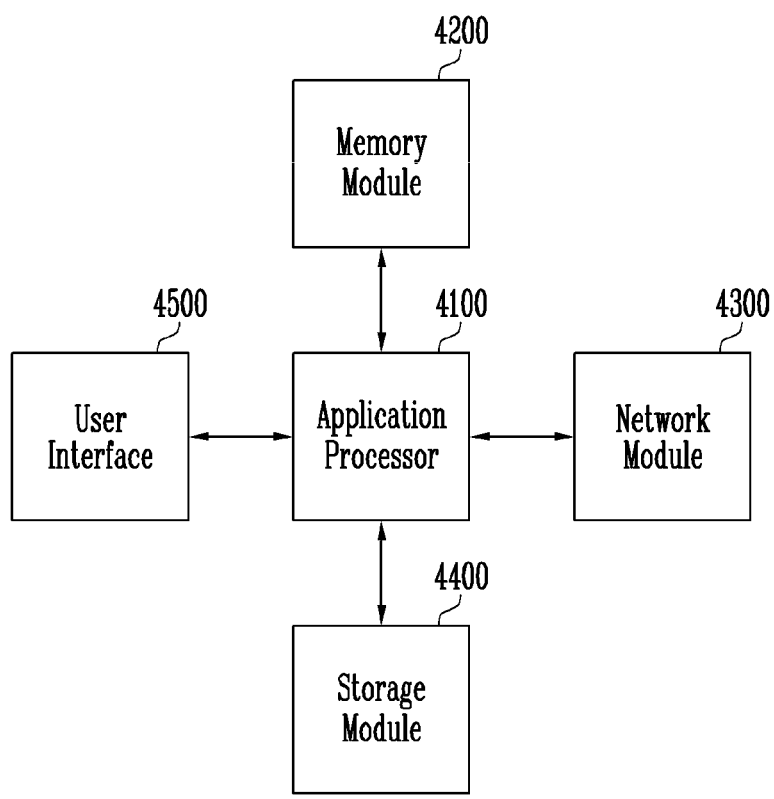
FIG. 21 is a block diagram illustrating a user system to which the storage device according to an embodiment of the present disclosure is applied.

FIG. 21 is a block diagram illustrating a user system 4000 to which a storage device according to an embodiment of the present disclosure is applied.

Referring to FIG. 21, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include one or more of controllers, interfaces, graphics engines, and the like that control the components included in the user system 4000. The application processor 4100 may be provided as a system-on-chip (SoC).

In an embodiment, the application processor 4100 may increase an activation count corresponding to an index to which a logical block address received together with a read request from a host belongs. In addition, when the activation count is equal to or greater than a reference value, the application processor 4100 may output map data corresponding to the index to the host.

However, since the number of map data that can be stored in the host is limited, when map data stored in the host is in a saturation state, the application processor 4100 may decrease the activation count corresponding to the index. A method of decreasing the activation count may be various.

Thereafter, the application processor 4100 may distinguish a deactivation index and an activation index through a deactivation index scan operation. When the number of map data corresponding to the activation indices is equal to or less than the number of map data, which can be stored in the host, the application processor 4100 may output the map data corresponding to the activation indices to the host.

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, or an LPDDR3 SDRAM, or a non-volatile random access memory, such as a PRAM, a ReRAM, an MRAM, or an FRAM. For example, the application processor 4100 and the memory module 4200 may be packaged based on a package on package (POP), and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. In another embodiment, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented with a non-volatile semiconductor memory element such as a phase-change RAM (PRAM), a magnetic RAM (MRAM), a resistive RAM (RRAM), a NAND flash, a NOR flash, or a three-dimensional NAND flash. For example, the storage module 4400 may be provided as a removable storage device (or removable drive), such as a memory card, or an external drive of the user system 4000.

For example, the storage module 4400 may include a plurality of non-volatile memory devices, and the plurality of non-volatile memory devices may correspond to the memory device described with reference to FIGS. 2 and 3. The storage module may correspond to the storage device 50 described with reference to FIG. 1.

The user interface 4500 may include interfaces for inputting data or an instruction to the application processor 4100 or for outputting data to an external device. For example, the user interface 4500 may include any of user input interfaces such as a keyboard, a keypad, a button, a touch panel, a touch screen, a touch pad, a touch ball, a camera, a microphone, a gyroscope sensor, a vibration sensor, a piezoelectric element, and so on. The user interface 4500 may include any of user output interfaces such as a liquid crystal display (LCD), an organic light emitting diode (OLED) display device, an active matrix OLED (AMOLED) display device, an LED, a speaker, a monitor, and so on.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A method of operating a memory controller, the method comprising:
   receiving a request from a host;
   generating an activation count indicating a total number of times requested for a logical block address corresponding to the request;
   outputting selected map data corresponding to an index to the host based on an activation signal, indicating an index of map data including the logical block address, wherein the activation signal is output by an address counter of the memory controller when the activation count exceeds a reference value; and
   decreasing the activation count by a preset size when a size of the selected map data exceeds a storage capacity of the host allocated for storing the selected map data.

2. The method of claim 1, wherein generating the activation count comprises:
   generating an increased activation count, when the request received from the host is a read request; and
   generating a decreased activation count, when the request received from the host is a program request or an erase request.

3. The method of claim 1, wherein outputting the selected map data to the host comprises outputting selected map data indicating a mapping relationship between logical block addresses corresponding to the index and corresponding physical block addresses.

4. The method of claim 1, wherein decreasing the activation count comprises decreasing activation counts corresponding to all activation indices, by a predetermined size.

5. The method of claim 1, wherein decreasing the activation count comprises:
   decreasing an activation count corresponding to a first index, to which a logical block address corresponding to a program or erase request belongs, by a predetermined size; and
   maintaining activation counts corresponding to indices except for the activation count corresponding to the first index.

6. The method of claim 1, wherein decreasing the activation count comprises:
   decreasing an activation count corresponding to a first index, to which a logical block address corresponding to a program or erase request belongs, by a predetermined size; and
   decreasing activation counts corresponding to indices except for the activation count corresponding to the first index by a preset size.

7. The method of claim 6, wherein decreasing the activation count comprises decreasing the activation counts corresponding to the indices by differentiating the decreased sizes of the activation counts according to sizes of the activation counts corresponding to the indices.

8. A memory controller, comprising:
   a processor;
   an address counter configured to receive a request from a host, generate an activation count indicating a total number of times requested for a logical block address corresponding to the request, and output an activation signal indicating an index of map data including the logical block address when the activation count exceeds a reference value; and
   a map data selector configured to output selected map data corresponding to the index to the host based on the activation signal,
   wherein the address counter decreases the activation count by a preset size when a size of the selected map data exceeds a storage capacity of the host allocated for storing the selected map data.

9. The memory controller of claim 8, wherein
   the address counter is configured to generate the activation count in response to the request.

10. The memory controller of claim 9, wherein the address counter is configured to generate an increased activation count, when the request received from the host is a read request, and
    the address counter is configured to generate a decreased activation count, when the request received from the host is a program request or an erase request.

11. The memory controller of claim 8, wherein when the activation count is equal to or greater than the reference value, the index is determined as an activation index, and
    when the activation count is less than the reference value, the index is determined as an deactivation index.

12. The memory controller of claim 11, wherein the map data selector is configured to output selected map data indicating a mapping relationship between logical block addresses corresponding to the index and corresponding physical block addresses.

13. The memory controller of claim 11, wherein the map data selector is configured to output a deactivation index scan request for detecting the deactivation index to the address counter when the size of the selected map data exceeds the storage capacity of the host.

14. The memory controller of claim 13, wherein, when the activation signal is a first activation signal, the address counter is configured to detect the deactivation index in response to the deactivation index scan request, and then output a second activation signal to the map data selector.

15. The memory controller of claim 14, wherein the map data selector is configured to output a decrease request for decreasing an activation count to the address counter when a size of map data selected based on the second activation signal exceeds the storage capacity of the host.

16. The memory controller of claim 15, wherein the address counter is configured to decrease activation counts corresponding to all activation indices by a predetermined size in response to the decrease request.

17. The memory controller of claim 15, wherein, in response to the decrease request, the address counter is configured to decrease an activation count corresponding to a first index, to which a logical block address corresponding to a program or erase request belongs, by a predetermined size, and maintain activation counts corresponding to indices except for the activation count corresponding to the first index.

18. The memory controller of claim 15, wherein, in response to the decrease request, the address counter is configured to decrease an activation count corresponding to a first index, to which a logical block address corresponding to a program or erase request belongs, by a predetermined size, and decrease activation counts corresponding to indices except for the activation count of the first index by a preset size.

19. The memory controller of claim 18, wherein the address counter is configured to decrease the activation counts corresponding to the indices by differentiating the decreased sizes of the activation counts according to sizes of the activation counts corresponding to the indices.

20. The memory controller of claim 15, wherein the address counter is configured to decrease the activation count in response to the decrease request and then outputs a third activation signal, and the map data selector is configured to output again selected map data to the host based on the third activation signal and the storage capacity of the host.

* * * * *